United States Patent [19]
Koike

[11] Patent Number: 5,940,316
[45] Date of Patent: Aug. 17, 1999

[54] FERROELECTRIC MEMORY DEVICE USING A FERROELECTRIC MATERIAL AND METHOD OF READING DATA FROM THE FERROELECTRIC MEMORY DEVICE

[75] Inventor: Hiroki Koike, Tokyo, Japan

[73] Assignee: NEC Corporation, Tokyo, Japan

[21] Appl. No.: 09/100,594

[22] Filed: Jun. 19, 1998

[30] Foreign Application Priority Data

Jun. 25, 1997 [JP] Japan ................................. 9-168939

[51] Int. Cl.$^6$ ............................................. G11C 11/22
[52] U.S. Cl. .................... 365/145; 365/210; 365/185.2; 365/189.04
[58] Field of Search ............................ 365/145, 117, 365/210, 185.2, 185.03, 65, 189.04, 207, 196

[56] References Cited

U.S. PATENT DOCUMENTS 5,297,077  3/1994  Imai et al. .............................. 365/145
5,621,680  4/1997  Newman et al. ....................... 365/145

FOREIGN PATENT DOCUMENTS 2-301093  12/1990  Japan .
7-147094   6/1995  Japan .
8-045279   2/1996  Japan .

Primary Examiner—David Nelms
Assistant Examiner—Thong Le
Attorney, Agent, or Firm—Foley, Hoag & Eliot LLP

[57] ABSTRACT

A ferroelectric memory device hardly affected by variations in characteristic of a ferroelectric capacitor is provided. Capacitors in two dummy memory cells are used such that one capacitor is a ferroelectric capacitor and always outputs a voltage corresponding to "0" while the other capacitor outputs a voltage corresponding to a sensitivity of a sense amplifier, both of the voltages are collectively used as a reference voltage.

18 Claims, 18 Drawing Sheets

FERROELECTRIC MEMORY DEVICE USING A FERROELECTRIC MATERIAL AND METHOD OF READING DATA FROM THE FERROELECTRIC MEMORY DEVICE

BACKGROUND OF THE INVENTION (1) Field of the Invention

The present invention relates to a ferroelectric memory device using a ferroelectric material and a method of reading data from the ferroelectric memory device.

(2) Description of the Prior Art

In recent years, non-volatile memories, which have a function of retaining the storage even when the power is turned off, have been realized using a ferroelectric material with a hysteresis characteristic such as lead zirconate titanate ($PZT:Pb(Zr_xTi_{1-x})O_3$) in memory cells. The operation of a non-volatile memory circuit using a general ferroelectric material (hereinafter referred to as a ferroelectric memory) will be described in the following.

FIG. 1 illustrates an example of a memory cell circuit comprising a single transistor and a single ferroelectric capacitor (hereinafter referred to as a 1T/1C type memory cell). In this memory cell circuit, transistor TC in memory cell MC has a gate terminal connected to word line WL, a source terminal connected to one terminal of ferroelectric capacitor FC, and a drain terminal connected to bit line BL. The other terminal of ferroelectric capacitor FC is connected to plate line PL.

In the memory cell circuit shown in FIG. 1, a voltage on word line WL controls transistor TC to turn on and off to determine whether the memory cell is selected or unselected. Data is written into and read from ferroelectric capacitor FC via a bit line.

FIG. 2 illustrates the relationship of spontaneous polarization charge Q of ferroelectric capacitor FC with regard to voltage V across both electrodes of ferroelectric capacitor FC. For example, the states of polarization of ferroelectric capacitor FC designated by A, B correspond to data "1", data "0" respectively. Upon applying voltage Ve across both electrodes of ferroelectric capacitor FC, charge Q1 shown in FIG. 2 is outputted from ferroelectric capacitor FC onto bit line BL in the case of data "1", while charge Q0 shown in FIG. 2 is outputted from ferroelectric capacitor FC onto bit line BL in the case of data "0". By discriminating the difference between charge Q1 and charge Q0 thus outputted, storage of binary information can be achieved.

As described above, a memory device using a ferroelectric capacitor retains data by the polarization occurring within the ferroelectric material even when an external voltage across the ferroelectric capacitor is equal to zero, thereby providing a characteristic of a so-called non-volatile storage operation capable of retaining storage even when the power is turned off.

FIG. 3 illustrates a circuit column portion in memory cell array using the above-mentioned 1T/1C type memory cell as shown in FIG. 1. This memory cell array comprises memory cells MC11–MCn1, MC12–MCn2, transistor TC11 and ferroelectric capacitor FC11 included in memory cell MC11, bit line precharge circuits PC1, PC2, reference voltage generating circuits DC11, DC21, DC12, DC22, and sense amplifier circuit SAMP2 serving as a differential amplifier circuit. In FIG. 3, word lines are designated by WLL1–WLn; plate lines by PL1–PLn; bit lines by BL1, $\overline{BL1}$, BL2, $\overline{BL2}$; a bit line precharge control signal line by PBL; a bit precharge voltage line by VBL; reference voltage generating circuit control signal lines by DWL1, DWL2; and a sense amplifier circuit control signal line by SE.

A signal voltage supplied from the memory cell, for example, when memory cell MC11 is selected, appears on bit line BL1. It can be determined whether the signal voltage appearing on bit line BL1 corresponds to "0" or "1" by generating a voltage serving as a reference voltage on bit line $\overline{BL1}$ which forms a pair with bit line BL1 and using a differential amplifier circuit such as a sense amplifier circuit. In this case, the reference voltage is typically set to an intermediate voltage value between a read signal voltage corresponding to data "0" and a read signal voltage corresponding to data "1".

FIG. 4 illustrates operation timing charts for the memory cell array shown in FIG. 3 described above. These timing charts are based on a method described in the proceedings for International Solid-State Circuits Conference (ISSCC), February, 1994, pp268–269. In the following, the reading operation and writing operation for the ferroelectric memory, when word line WL1 is selected and memory cell MC11 is to be considered, is described with reference to FIGS. 3 and 4. It should be noted that in operation timing charts, also in the other drawings later described, a level corresponding to the high level "H" is either a power supply voltage supplied from the external of the memory device or a voltage generated in a voltage generating circuit provided in the memory device, while a level corresponding to the low level "L" is a ground voltage, unless otherwise remarked. For reference, the states of polarization of ferroelectric capacitor FC11 at the end of each of periods ①–⑥ in FIG. 4 are shown at the bottom of FIG. 4.

In periods ①–③ in FIG. 4, an operation is performed for reading data from the memory cell. First, bit line precharge control signal PBL is changed to the low level in period ① to release bit line precharge. Here, bit line precharge voltage VBP is set at a ground potential.

Next, word line WL1 and plate line PL1 are respectively changed to the high level to output data from memory cell MC11 onto bit line BL1 in period ②. Although data is outputted from memory cell MC12 onto bit line BL2 at the same time, description for the operation associated with memory cell MC12 and bit line BL2 is omitted to avoid confusion since the operation of memory cell MC12 is similar to that of memory cell MC11. At this point, the data signal outputted from memory cell MC11 depends on the polarization state of ferroelectric capacitor FC11. FIG. 4 illustrates how data "1" is read by way of example. On the other hand, a proper reference voltage is generated by reference voltage generating circuit DC21 on bit line $\overline{BL1}$ which forms a pair with bit line BL1 with control signal DWL2.

After generating the reference voltage, in period ③, sense amplifier circuit control signal SE is activated to differentially amplify the difference in voltage between bit line BL1 and bit line $\overline{BL1}$ by sense amplifier circuit SAMP1.

In subsequent periods ④–⑥, the operations are performed for writing back the data, which have been read in periods ①–③, to memory cell MC11. This data write-back operation is needed because the data in ferroelectric capacitor FC11 have been collapsed in period ②. When data inputted from the outside of the ferroelectric memory device is written into a memory cell, a voltage corresponding to desired data is set on bit line BL1 and bit line $\overline{BL1}$ in period ③ and then the operations in period ④ onward are performed.

In period ④, plate line PL1 is changed to the low level. In the subsequent period ⑤, sense amplifier circuit control signal SE is changed to the low level to deactivate sense amplifier circuit SAMP1, and bit line precharge control signal PBL is changed to the high level to change the bit line level to the ground potential. Thus, the polarization of ferroelectric capacitor FC11 can be recovered to the state of period ① before data is read. Finally, word line W1 is changed to the low level to turn off transistor TC11, thereby completing the access operation to memory cell MC11.

Now, the relationship between the above-mentioned circuit operation and the characteristics of a ferroelectric capacitor is described. For example, the state in period ② in FIG. 4, where word line WL1 is changed to the high level to cause conduction in transistor TC11 and plate line PL1 is changed to high level corresponds to the state in which voltage −Ve is applied to the ferroelectric capacitor (assume herein that the direction from the plate line to the bit line is in the positive direction of the voltage). At this point, charge Q1 or charge Q0 is outputted onto bit line BL1. In this state, however, the polarization of the ferroelectric capacitor is at h point in FIG. 2 when either one of data "1" or "0" is stored, so that it can not be determined whether the data corresponds to data "1" or "0". Thus, an operation is required for applying a voltage of +Ve or 0 to the ferroelectric capacitor respectively depending on the read "1" or "0" data and writing the data back to the memory cell. This operation corresponds to that in period ④ in FIG. 4.

In the example shown in FIGS. 3 and 4, both plate line and bit line are driven between the low level and the high level to allow voltages both in positive and negative directions to be applied across both electrodes of the ferroelectric capacitor, thereby allowing for either one of data "0" and "1" to be written to the ferroelectric capacitor. On the other hand, there is an operating method in which the plate line is set at an intermediate potential between the low level and the high level, and the bit line is driven between the low level and the high level, thereby allowing voltages both in positive and negative directions to be applied across both electrodes of the ferroelectric capacitor.

An example of the operation method mentioned above is described in the proceedings for International Solid-State Circuits Conference (ISSCC), February, 1996, pp368–369. FIG. 5 illustrates a circuit diagram of a portion of an example of a ferroelectric memory cell array employing the above-mentioned operating method and FIG. 6 illustrates operation timing charts thereof. In the following description, the same reference numerals and symbols are used to designate the same components of those illustrated in FIGS. 3 and 4 and the description thereon is omitted unless additional description is not particularly required.

The memory cell array illustrated in FIG. 5 is provided with bit line balance control circuits EB1, EB2. A bit line balance control signal line is designated by EBL in FIG. 5. The states of polarization of ferroelectric capacitor FC11 at the end of each of the periods ①–⑥ are shown at the bottom of FIG. 6 for reference. The reading operation and writing operation will be hereinafter described for the case where word line WL1 is selected and memory cell MC11 is to be considered with reference to FIG. 5 and FIG. 6, similarly to the description for FIGS. 3 and 4.

First, bit line precharge control signal PBL is changed to the low level to release the bit line precharge in period ①. Bit line precharge voltage $V_{BP}$ is at a ground potential similarly to the example of FIGS. 3 and 4.

Next, in period ②, word line WL1 is changed to the high level to output data from memory cell MC11 onto bit line B11. The operation of FIG. 6 differs from that of FIG. 4 in that plate line PL1 remains at an intermediate potential (hereinafter referred to as voltage Vm). Since the bit line precharge level is at the ground potential and the plate line is at the intermediate potential, a voltage substantially equal to voltage −Vm, assuming that a direction from the plate line to the bit line is a positive direction of the voltage, is applied across both electrodes of ferroelectric capacitor FC11 when transistor TC11 is in a conducted state in period ②. Then, signal charge corresponding to the state of the polarization is read from ferroelectric capacitor FC11 onto bit line BL1. At the same time, a proper reference voltage is generated by reference voltage generating circuit DC21 on bit line $\overline{BL1}$ which forms a pair with bit line BL1. In the subsequent period ③, sense amplifier circuit control signal SE is activated to differentially amplify the difference in voltage between bit line BL1 and bit line $\overline{BL1}$ by sense amplifier circuit SAMP1.

When data inputted from the outside of a memory device is written into the memory cell, a voltage corresponding to desired data is set on bit line BL1 and bit line $\overline{BL1}$ in period ④ and then operations in period ⑤ onward are performed.

In period ⑤, sense amplifier circuit control signal SE is changed to the low level to deactivate sense amplifier circuit SAMP1. Furthermore, bit line balance control signal EBL is changed to the high level to set bit line BL1 at the same intermediate potential as plate line PL1. Thus, the polarization of ferroelectric capacitor FC11 can be recovered to the state in period ① before data is read.

After word line WL1 is changed to the low level to turn off transistor FC11 in period ⑥, bit lines BL1, $\overline{BL1}$ are changed to the ground potential in period ⑦, thereby completing the access operation to memory cell MC11.

The signal charge read from the ferroelectric capacitor depends on a voltage value applied across both electrodes of the ferroelectric capacitor. Generally, as the voltage value applied across both electrodes is higher, the signal charge is increased. In the operation of the ferroelectric memory device as that in the example described above, the voltage applied across both electrodes of the ferroelectric capacitor is related to a plate line setting voltage and a bit line voltage amplitude.

The plate line setting voltage and the bit line voltage amplitude may be set at any value as long as the sense amplifier can normally sense and amplify a signal voltage read from the ferroelectric capacitor. For example, there are methods in which the voltage for setting the plate line is one half the level of the power supply voltage and the bit line amplitude is at a level between the ground potential and the power supply voltage. The power supply voltage may be either a voltage supplied from the outside of the memory device or a voltage generated in a voltage generating circuit in the memory device.

As described above, in the operation of the ferroelectric memory device, a voltage serving as reference need be generated when the data read from the memory cell is amplified in the sense amplifier circuit. A specific example of such a reference voltage generating circuit is described in the above-mentioned literature (proceedings for International Solid-State Circuits Conference (ISSCC), February, 1994, pp368–369). FIG. 7 illustrates the circuit and FIG. 8 illustrates operation timing charts associated with the circuit.

In FIG. 7, the memory cell array unit has sense amplifier circuit SAMP1 comprising CMOS inverters cross-connected to each other and reference voltage generating circuits DC11, DC21. Reference voltage generating circuits DC11, DC12 have transistors DTC11, DTC21 and ferroelectric capacitors DFC11, DFC21 in respective cells, and further have transistors DTR11, DTR21, each of which is provided for compensating for a potential at a node where the transistor and the ferroelectric capacitor are connected to each other in a dummy memory cell. These reference voltage generating circuits DC11, DC21 are also referred to as dummy memory cells since they have a similar configuration to that of a 1T/1C type memory cell, based on a circuit comprising a transistor and a ferroelectric capacitor. In FIG. 7, a signal line for controlling transistor DTR11 and transistor DTR21 is indicated by CDWL and signal lines for controlling the sense amplifier circuit are indicated by SAP, SAN respectively.

An essential point of the method of generating a reference voltage with the dummy memory cell shown in FIG. 7 is that the Q-V hysteresis characteristic of ferroelectric capacitor FC11 in the memory cell and the Q-V hysteresis characteristic of ferroelectric capacitor DFC11 in the dummy memory cell are set to have a relationship as shown in FIG. 9. In FIG. 9, a smaller hysteresis curve represents ferroelectric capacitor FC11. Similarly to the example in FIG. 2, -Qr (cell) point and +Qr (cell) point are made to correspond to data "0" and "1", respectively.

When plate line PL1 is driven from the low level to the high level in the circuit shown in FIG. 7 (period ② in FIG. 8), a voltage outputted from memory cell MC11 onto bit line BL1 is equal to voltage $V_0$ in FIG. 9 when data "0" has been stored in ferroelectric capacitor FC11 while the voltage is equal to voltage $V_1$ in FIG. 9 when data "1" has been stored in ferroelectric capacitor FC11. It should be noted that voltage $V_0$ corresponds to the distance from an intersection of a straight line passing through (-Vcc, -Qr(cell)) with the slope of CB (parasitic capacitance of bit line BL1) and the hysteresis curve for ferroelectric capacitor FC11 to the straight line V=-Vcc, and voltage $V_1$ corresponds to the distance from an intersection of a straight line passing through (-Vcc, +Qr(cell)) with the slope of CB and the hysteresis curve for ferroelectric capacitor FC11 to the straight line V=-Vcc. On the other hand, when the characteristic for capacitor DFC11 in the dummy memory cell is represented by a larger hysteresis curve in FIG. 9 and capacitor DFC11 always has data "0" stored therein, a voltage, which is supplied onto bit line $\overline{BL1}$ when DPL in FIG. 7 is driven from the low level to the high level, is equal to voltage $V_{REF}$ in FIG. 9 as is the case of above-mentioned ferroelectric capacitor FC11. In the hysteresis characteristic shown in FIG. 9, the following relationship is satisfied.

$$V_0 < V_{REF} < V_1 \quad (1)$$

Thus, sense amplifier SAMP1 can determine whether the data read from memory cell MC11 corresponds to data "0" or "1".

The foregoing proceedings for ISSCC February, 1994, page 268 describes that the hysteresis characteristic curve for above-mentioned capacitor DFC11 or the like can be changed in shape by changing the size of the ferroelectric capacitor.

In the prior art method of generating a reference voltage in the ferroelectric memory device as described above, however, the signal charge corresponding to the reference voltage is generated by adjusting the size of the ferroelectric capacitor in the dummy memory cell so that the ferroelectric capacitor in the dummy memory cell and the ferroelectric capacitor in the memory cell may have different shapes from each other. Thus, the prior art method of generating a reference voltage has a disadvantage that a generated reference voltage is easily affected by variations in characteristics of the ferroelectric capacitors. For example, when the shapes of the hysteresis characteristic curves for ferroelectric capacitor FC11 and capacitor DFC11 are changed due to variations in manufacturing such that the value of voltage VREF is not an intermediate value between voltage $V_0$ and voltage $V_1$ in FIG. 9, a normal reference voltage can not be generated, thereby causing malfunction.

Additionally, ferroelectric materials generally have a characteristic referred to as fatigue characteristic. This is a characteristic wherein the charge during inversed polarization (charge corresponding to charge Q1 in FIG. 2) is reduced as polarization inversion is repeated as shown in FIG. 10. The fatigue characteristic causes the voltage value for voltage $V_1$ to be lowered as the reading/writing operations for data "1" are repeated, finally leading to the disadvantage of reducing the margin for reading data "1".

SUMMARY OF THE INVENTION

It is a first object of the present invention to provide a ferroelectric memory device which solves the above-mentioned problems and is hardly affected by variations in characteristics of ferroelectric capacitors.

It is a second object of the present invention to provide a method for reading data from the ferroelectric memory device to achieve such a ferroelectric memory device.

In order to achieve the first object, the ferroelectric memory device according to the present invention has a memory cell comprising a field-effect transistor and a ferroelectric capacitor using a ferroelectric material as an insulator film, the memory cell being operated for storage by making the direction of spontaneous polarization of the ferroelectric capacitor correspond to the information for storage;

a sense amplifier circuit for discriminating a difference in amount of charge between the inversed and non-inversed states of the direction of the spontaneous polarization of the ferroelectric capacitor in the memory cell to read a signal voltage from the memory cell; and reference voltage generating means for generating a reference voltage in order to discriminate the difference in amount of charge between the inversed state and the non-inversed state, wherein the reference voltage generating means generates a voltage as a reference voltage obtained by adding a voltage exceeding the minimum voltage at which a signal voltage is readable by the sense amplifier circuit from the memory cell to a signal voltage obtained with the signal charge stored in the memory cell when the direction of the spontaneous polarization of the ferroelectric capacitor in the memory cell is in the non-inversed state.

The above-mentioned ferroelectric memory device may be formed such that the memory cell includes a field-effect transistor having a source terminal connected to one terminal of the ferroelectric capacitor, a drain terminal connected to a bit line and a gate terminal connected a word line, and a ferroelectric capacitor having the other terminal connected to a plate line, the sense amplifier circuit is composed of a sense amplifier having first and second terminals, the first terminal being inputted with a signal voltage obtained by reading the signal charge from the memory cell onto the bit line, the second terminal being inputted with the reference voltage, the sense amplifier being provided for differentially amplifying the difference in voltage between the first and the second terminal to discriminate a logical value of the signal charge outputted from the memory cell, the reference voltage generating means generates a voltage as a reference voltage obtained by adding a voltage exceeding the sense amplifier sensitivity which is the minimum voltage at which the sense amplifier is capable of amplifying a signal voltage read from the memory cell to a signal voltage obtained by reading the signal charge when the direction of the spontaneous polarization of the ferroelectric capacitor in the memory cell is in the non-inversed state onto the bit line.

In the case described above, the ferroelectric memory device may be formed such that the reference voltage generating means has first and second dummy memory cells, the first dummy memory cell has a transistor and a ferroelectric capacitor, the transistor having a gate terminal connected to a first dummy word line, a source terminal connected directly to or connected electrically through a transfer gate to the second terminal of the sense amplifier, and a drain terminal connected to one terminal of the ferroelectric capacitor, the ferroelectric capacitor having the other terminal connected to a first dummy plate line, the second dummy memory cell has a transistor and a capacitor, the transistor having a gate terminal connected to a second dummy word line, a source terminal connected to the source terminal of the transistor in the first dummy cell, and a drain terminal connected to one terminal of the capacitor, the capacitor having the other terminal connected to a second dummy plate line.

The capacitor in the first dummy memory cell may have the same shape as that of the memory cell.

The capacitor in the second dummy memory cell may include a parasitic capacitance including one of a gate capacitance, a capacitance between wiring layer, or a diffusion layer capacitance, or a combination thereof.

Furthermore, the capacitor in the second dummy memory cell may use a dielectric component of a ferroelectric capacitor.

Additionally, the ferroelectric memory device may be formed such that the terminal connecting the transistor to the ferroelectric capacitor in the first dummy memory cell is connected to a drain terminal of a second transistor different from said transistor, the second transistor having a source terminal connected to a signal line for giving a predetermined voltage, and the gate terminal is connected to a third dummy word line. In this case, a voltage exceeding the sense amplifier sensitivity may be adjusted by a voltage value given to the signal line connected to the source terminal of the second transistor.

In addition, the ferroelectric memory device may be formed such that the terminal connecting the transistor to the capacitor in the second dummy memory cell is connected to a drain terminal of a third transistor different from said transistor, the third transistor having a source terminal connected to a second signal line for giving a predetermined voltage, and the gate terminal is connected to a fourth dummy word line.

The ferroelectric memory device may be formed such that the source terminal of the transistor in the second dummy memory cell is connected directly to or connected electrically through a transfer gate to the second terminal of the sense amplifier.

The ferroelectric memory device may be formed such that the memory cells are arranged in matrix configuration and has a circuit system including one or a plurality of the sense amplifier for a memory cell array.

The ferroelectric memory device may be formed such that a voltage exceeding the sense amplifier sensitivity is set depending on a dielectric capacitance value of the capacitor in the second dummy memory cell.

Furthermore, the ferroelectric memory device may have driving means for driving a voltage on the second dummy plate line from a first voltage level to a second voltage level wherein a voltage exceeding the sense amplifier sensitivity is adjusted by driving the second dummy plate line from the first voltage level to the second voltage level.

To achieve the second object, the method of reading data from a ferroelectric memory device according to the present invention, the ferroelectric memory device having a memory cell comprising a field-effect transistor and a ferroelectric capacitor using a ferroelectric material as an insulator film, including the steps of:

operating for storage by making the direction of spontaneous polarization of the ferroelectric capacitor correspond to information for storage;

discriminating a difference in charge amount between two states of an inversed state and a non-inversed state of the direction of the spontaneous polarization in the memory cell to read a signal voltage from the memory cell; and obtaining a reference voltage for discriminating the difference in charge amount between two states of the inversed state and the non-inversed state by adding a voltage exceeding the minimum voltage at which a signal voltage is readable by a sense amplifier circuit from the memory cell to a signal voltage obtained with signal charge stored in the memory cell when the direction of the spontaneous polarization of the ferroelectric capacitor in the memory cell is in the non-inversed state.

In the case described above, the reference voltage may be a voltage obtained by adding a voltage exceeding the sense amplifier sensitivity which is the minimum voltage at which the sense amplifier is capable of amplifying the signal voltage read from the memory cell to a signal voltage obtained by reading the signal charge corresponding to a case in which the direction of the spontaneous polarization of the ferroelectric capacitor in the memory cell is in the non-inversed state onto the bit line of the memory cell.

The present invention as described above utilizes the fact that the amount of charge during the non-inversed polarization depend very little on a count of repeated polarization inversion shown in FIG. 10. Only the signal charge, corresponding to that occurring in a case where the direction of the spontaneous polarization of the ferroelectric capacitor in the memory cell is in a non-inversion state, is used, and a voltage, corresponding to the sense amplifier sensitivity, i.e. the minimum voltage required for normally sensing and amplifying a read signal voltage, is separately supplied for generating a reference voltage. Thus, the present invention eliminates the problem inaccurate reference voltage (being affected by fatigue characteristic) due to difference in the access frequency of the memory cell and the dummy memory cell, which problem may occur in the prior art.

According to the present invention, the ferroelectric capacitor in the memory cell and the ferroelectric capacitor in the dummy memory cell can have the same shapes, thereby making it possible to eliminate the problem that the ferroelectric capacitor in the memory cell and the ferroelectric capacitor in the dummy memory cell have different shapes of hysteresis characteristic curves due to variations in manufacturing, which may occur in the prior art.

As will be apparent from the description of an embodiment later described, on the condition that the amount of charge outputted from the ferroelectric capacitor during the non-inversed polarization is constant even after the ferroelectric material is fatigued, the ferroelectric capacitor in the memory cell and the ferroelectric capacitor in the dummy memory cell can have the same shapes in the ferroelectric memory device according to the present invention. This means that a desired reference voltage can be stably generated even if any of the variations in characteristics due to manufacturing and variations in characteristics due to use for a long time are seen in the ferroelectric capacitors. In this way, according to the present invention, a normal reference voltage can be stably generated so that it is possible to provide a memory device which hardly exhibits malfunction and has improved reliability.

The above and other objects, features and advantages of the present invention will become apparent from the following description with reference to the accompanying drawings which illustrate examples of the present invention.

DESCRIPTION OF THE PREFERRED EMBODIMENTS

The preferred embodiments according to the present invention will be hereinafter described with reference to the accompanying drawings.

Figure 11:
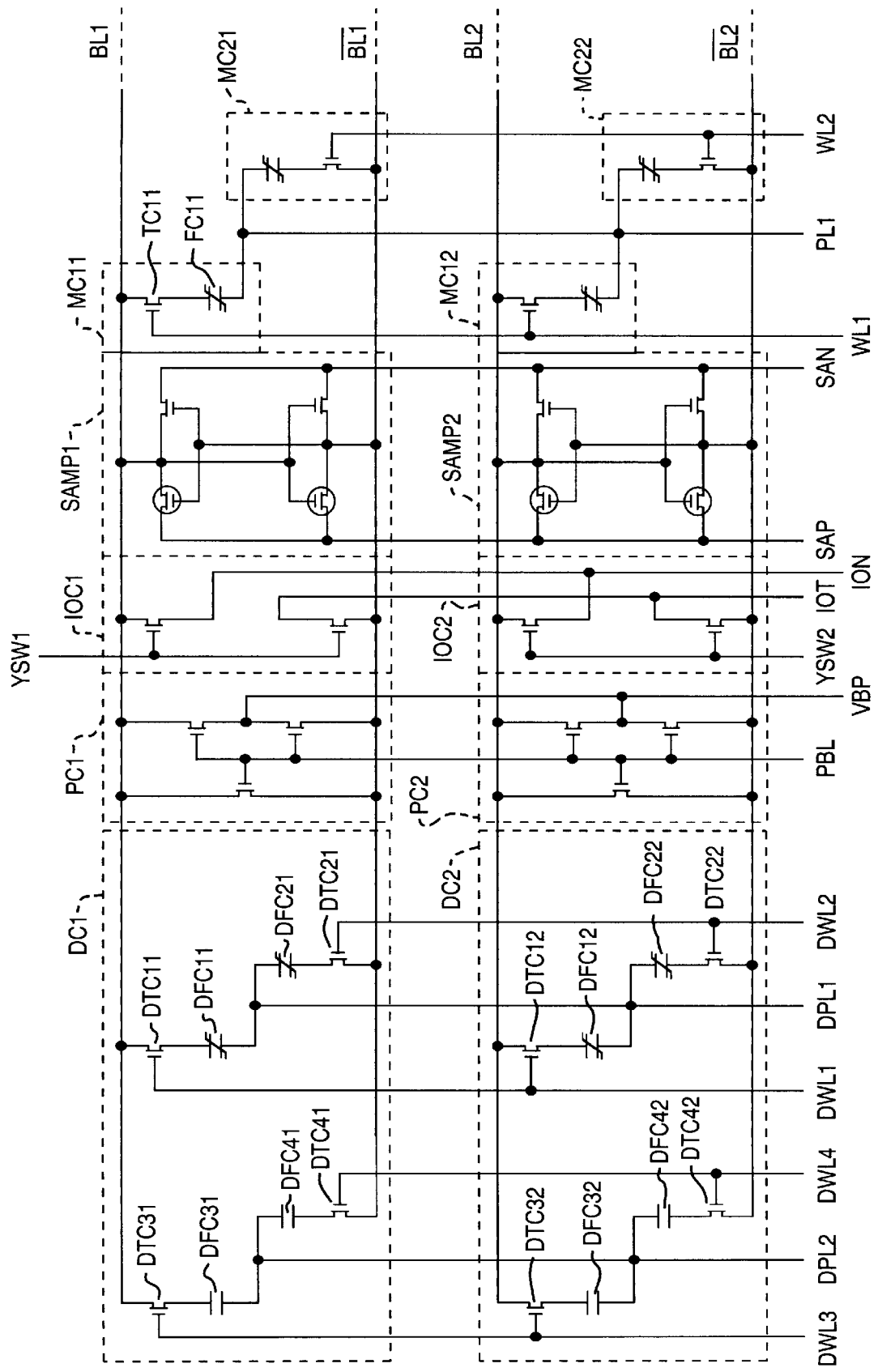
FIG. 11 is a circuit diagram illustrating a memory cell array unit including a reference voltage generating circuit in a ferroelectric memory device according to one embodiment of the present invention.

FIG. 11 is a circuit diagram illustrating a ferroelectric memory device according to an embodiment of the present invention. In FIG. 11, the ferroelectric memory device comprises data input/output circuits IOC1, IOC2; bit line precharge circuits PC1, PC2; reference voltage generating circuits DC1, DC2; dummy memory cell selecting transistors DTC11–DTC42; and dummy memory cell capacitors DFC11–DFC42. In FIG. 11, data input/output signal lines are designated by ION, IOT; column selecting signal lines by YSW1, YSW2; dummy word lines by DWL1-4; and dummy plate lines by DPL1–DPL2, respectively.

Figure 12:
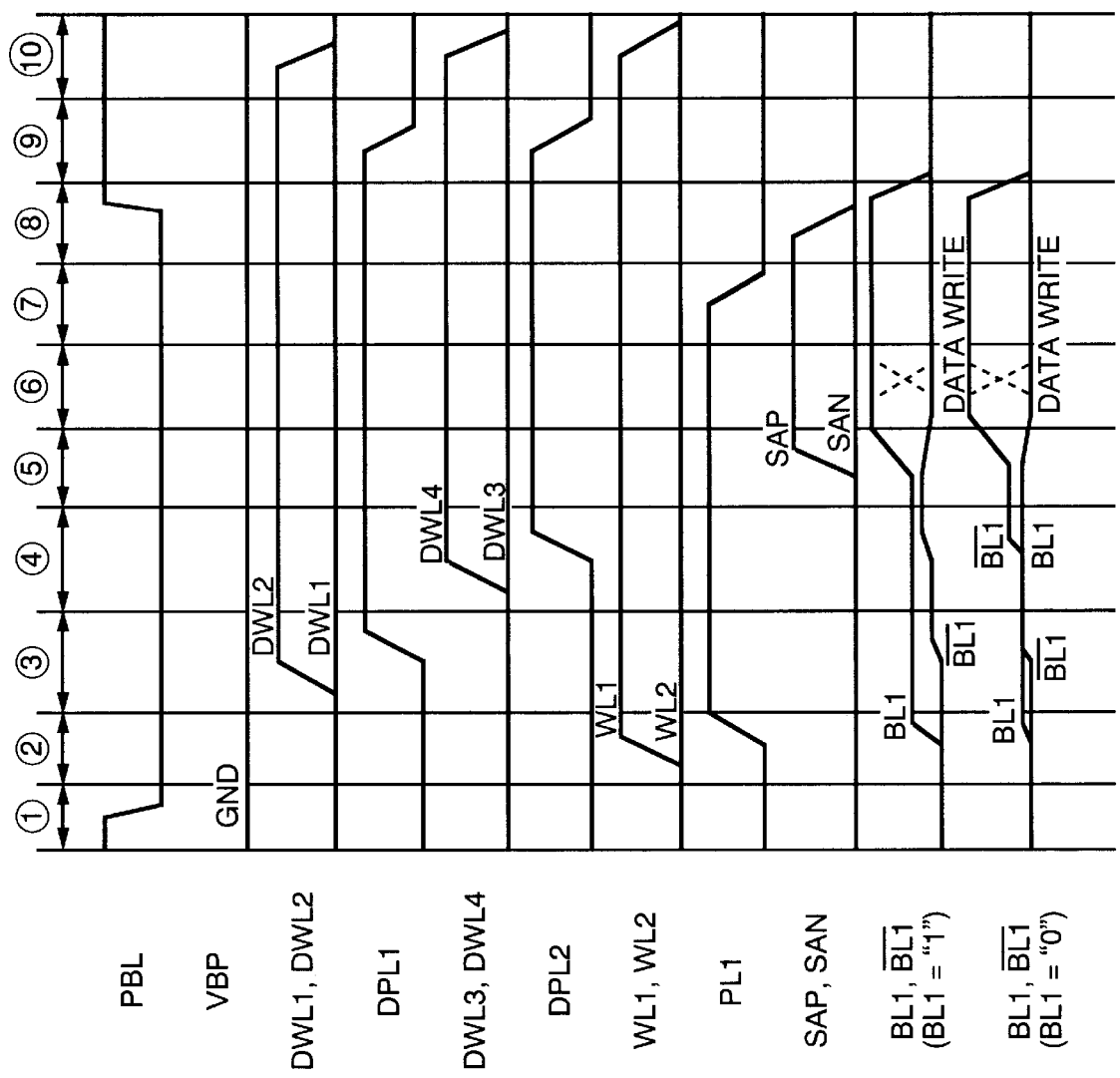
FIG. 12 illustrates timing charts representing an exemplary operation of the ferroelectric memory device shown in FIG. 11.

FIG. 12 illustrates operation timing charts of the circuit shown in FIG. 11. In the following, the reading operation and writing operation will be described when word line WL1 is selected and memory cell MC11 is to be considered with reference to FIGS. 11 and 12.

Assuming that for an initial state, dummy memory cell capacitors DFC11, DFC21, DFC12, DFC22 have been written with data "0" and that dummy memory cell capacitors DFC31, DFC41, DFC32, DFC42 respectively have voltages equal to zero across both ends thereof.

First, in period ①, bit line precharge control signal PBL is changed to the low level to release bit line precharge. Here, bit line precharge voltage $V_{BP}$ is set at a ground potential.

Next, in period ②, word line WL1 and plate line PL1 are changed to the high level to output data from memory cell MC11 onto bit line BL1. In the subsequent period ③, word line DWL2 and plate line DPL1 for the dummy memory cell are respectively changed to the high level in reference voltage generating circuit DC1 to output signal charge corresponding to data "0" from the dummy memory cell onto bit line $\overline{BL1}$.

Figure 9:
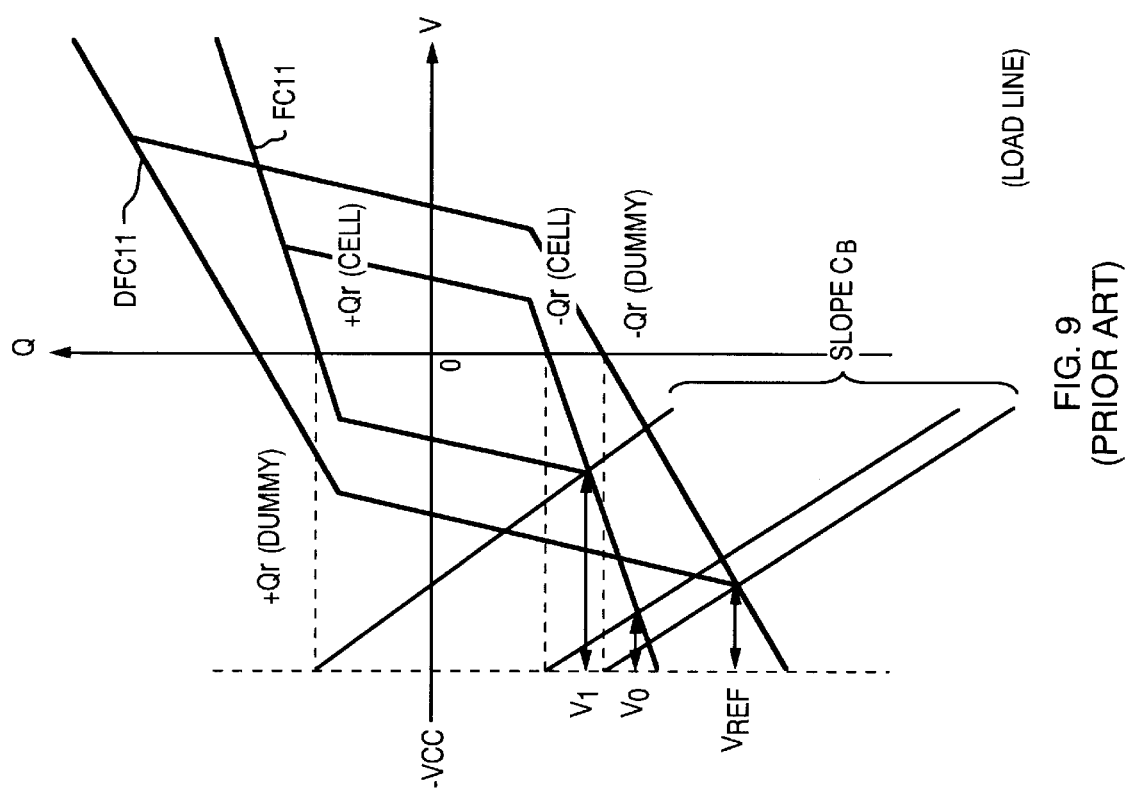
FIG. 9 is a graph illustrating the relationship of hysteresis characteristics for both a ferroelectric capacitor in the memory cell and a ferroelectric capacitor in a dummy memory cell.
Figure 10:
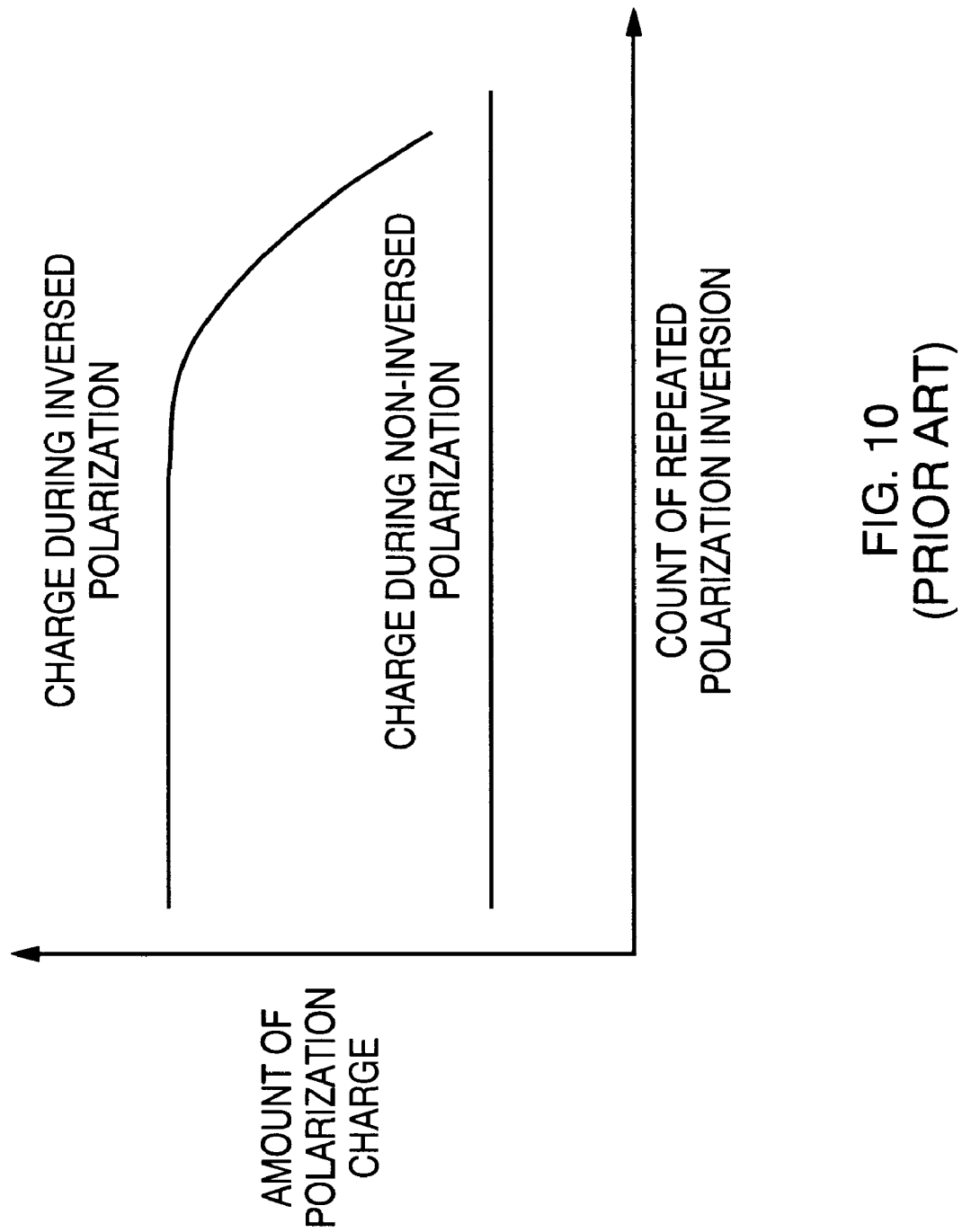
FIG. 10 is a graph illustrating a fatigue characteristic of a ferroelectric material.

Voltage $V_{BL1}$ appearing on bit line BL1 after the above-mentioned operations in periods ①–③ is represented using symbols for voltages shown in FIG. 9, as following:

when corresponding to data "1" $V_{BL1}=V_1$ (2a)

when corresponding to data "0" $V_{BL1}=V_0$ (2b)

On the other hand, a voltage $V_{(\overline{BL1})}$ appearing on bit line $\overline{BL1}$ is represented as following:

$$V_{(\overline{BL1})}=V_0 \qquad (3)$$

Subsequently in period ④, word line DWL4 is changed to the high level and further plate line DPL2 is changed to the high level. This operation causes plate line DPL2 to be capacitively coupled to bit line $\overline{BL1}$ through capacitor DFC41 to slightly increase the voltage on bit line $\overline{BL1}$. The voltage $V_{(\overline{BL1})}$ in this case is represented as following:

$$V_{(\overline{BL1})} = V_0 + \Delta V \qquad (4)$$

where a magnitude of $\Delta V$ is set to exceed the sensitivity of a sense amplifier using either of the following two methods.
(1) adjust the high level of plate line DPL2
(2) adjust the capacitance value of capacitor DFC41

Here, although word lines WL1, DWL2, DWL4 are sequentially activated for convenience, the order of activating the lines may be changed and is not particularly limited to this sequential activation.

The states resulting from the above-mentioned operations generates a difference in voltage between bit line BL1 and bit line $\overline{BL1}$. Thus, sense amplifier circuit control signals SAP, SAN are changed to the high level and the low level respectively in the next period ⑤ to differentially amplify the difference in voltage between bit line $\overline{BL1}$ and bit line BL1, thereby allowing data "0" or "1" to be obtained as data read from the memory cell. The data amplified in the sense amplifier circuit is outputted to the outside of the memory device via data signals ION, IOT by selecting one or more column selecting signal lines YSW1, YSW2 . . . , and changing the selected signal line(s) to the high level.

On the other hand, when data inputted from the outside of the memory device is written into the memory cell, a desired voltage corresponding to data to be written is set on bit lines BL1, $\overline{BL1}$ via data signal lines ION, IOT in period ⑥ and then operations after period ⑥ are performed.

In period ⑦ onward, a reset operation is performed. First, plate line PL1 is returned to the low level. Next, in period ⑧, sense amplifier circuit control signals SAP, SAN are changed to the low level and the high level respectively to recover sense amplifiers SAMP1, SAMP2 to the initial state. Then, bit line precharge control signal PBL is changed to the high level, thereby resetting bit lines BL1, $\overline{BL1}$, BL2, $\overline{BL2}$ to the low level.

In the subsequent period ⑨, plate lines DPL1, DPL2 are returned to the low level. At the start point of this period ⑨, both bit lines $\overline{BL1}$ and $\overline{BL2}$ are at the low level and plate line DPL1 is at the high level. This means that ferroelectric capacitors DFC21, DFC22 in the dummy memory cells are written with "0". Finally, in period ⑩, word lines WL1, DWL2, DWL4 are changed to the low level to deselect both the memory cell and the dummy memory cells, thereby completing the reading and writing operation for one cycle.

Although the description has been made in conjunction with memory cell MC11 connected to bit line BL1 being selected, when memory cell MC21 connected to bit line $\overline{BL1}$ is selected, the dummy memory cells having capacitors DFC11, DFC31 respectively are selected unlike the above-mentioned operation.

As described above, the present invention is characterized in that capacitors DFC21, DFC41 in two dummy memory cells are used such that capacitor DFC21 serving as a ferroelectric capacitor always outputs a voltage corresponding to data "0" while capacitor DFC41 outputs a voltage corresponding to the sensitivity of the sense amplifier, both of the voltages collectively function as a reference voltage. Since capacitor DFC21 may utilize a capacitor of the same structure as that in the memory cell, variations due to manufacturing may occur in both the ferroelectric capacitor in the memory cell and the ferroelectric capacitor in the dummy memory cell.

Additionally, on the condition that the amount of the read charge during a non-inversed polarization depends little on a count of repeated polarization inversion, voltage $V_0$ given by the above-mentioned equation (3) can be equally generated on the respective bit lines on the memory cell side and on the reference side. Furthermore, capacitor DFC41, as the gate capacitance of an MOS transistor and the like, exhibits little variation with present manufacturing techniques, thereby making it possible to precisely generating voltage $\Delta V$ in the above-mentioned equation (4).

From the above-mentioned features, the memory device according to the present embodiment advantageously has small variations due to manufacturing and is capable of precisely generate the reference voltage after the use for a long time.

(Other Embodiment)

Figure 1:
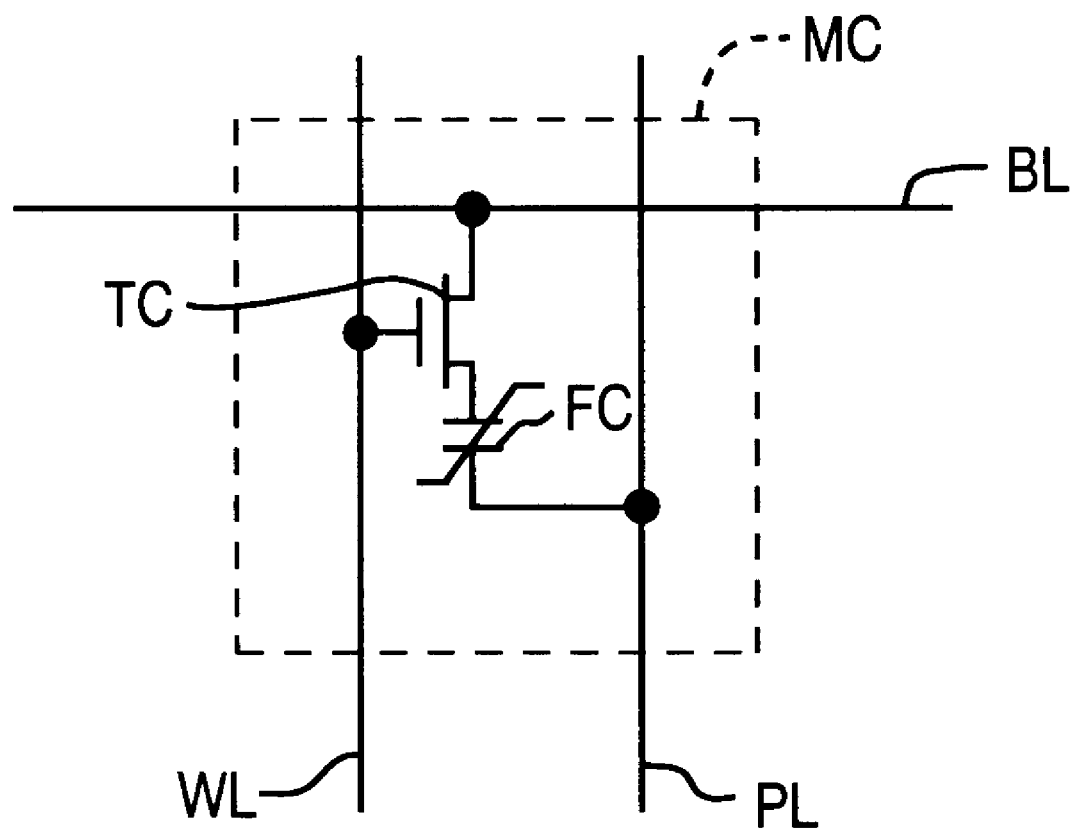
FIG. 1 is a circuit diagram illustrating an example of a memory cell circuit.
Figure 2:
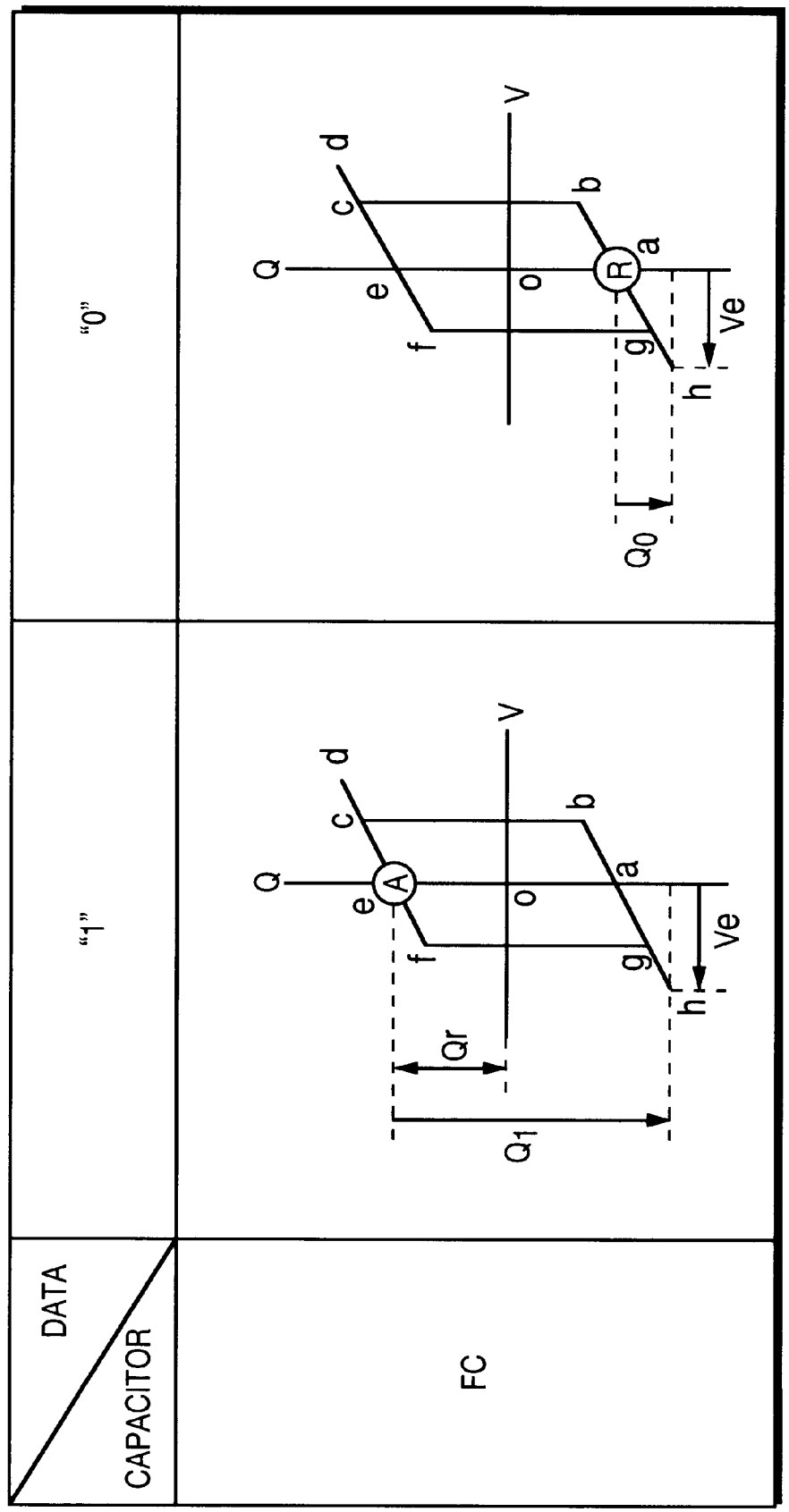
FIG. 2 is a graph illustrating the relationship between voltage V applied across both electrodes of a ferroelectric capacitor and polarization charge Q.
Figure 3:
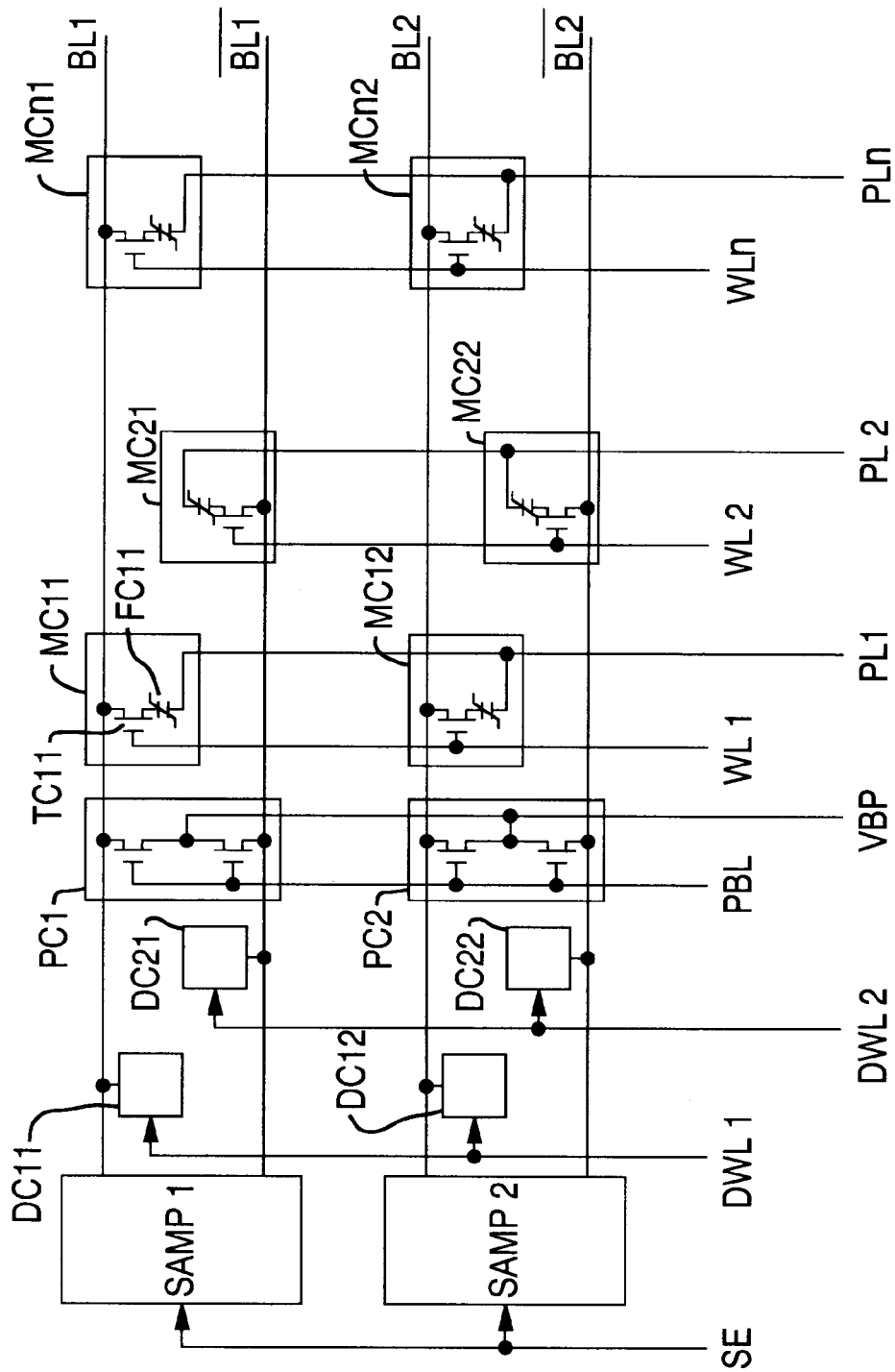
FIG. 3 is a circuit diagram illustrating a memory cell array unit circuit in a prior art ferroelectric memory device.
Figure 4:
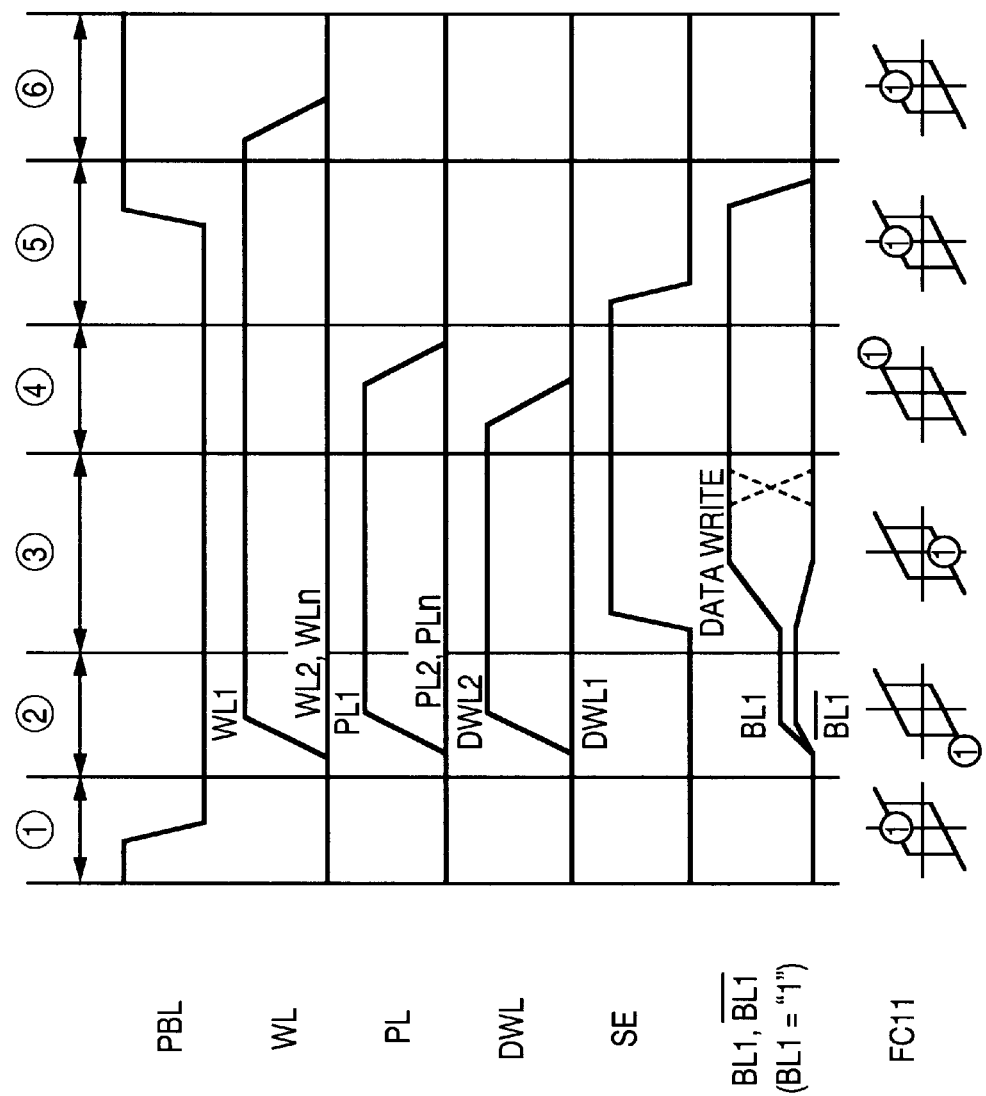
FIG. 4 illustrates timing charts showing an example of the operation of the ferroelectric memory device shown in FIG. 3.
Figure 5:
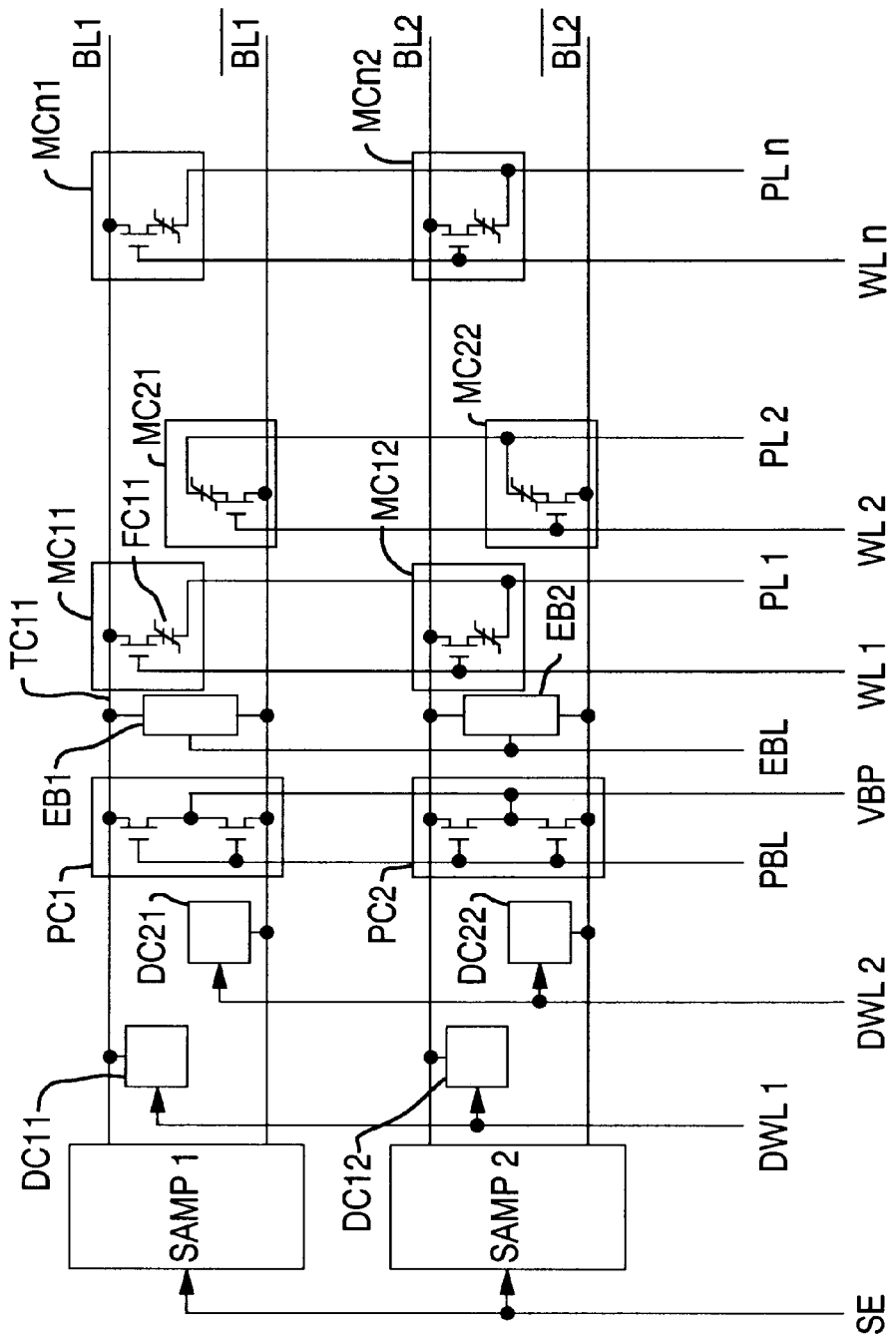
FIG. 5 is a circuit diagram illustrating a memory cell array unit circuit for another example in the prior art ferroelectric memory device.
Figure 6:
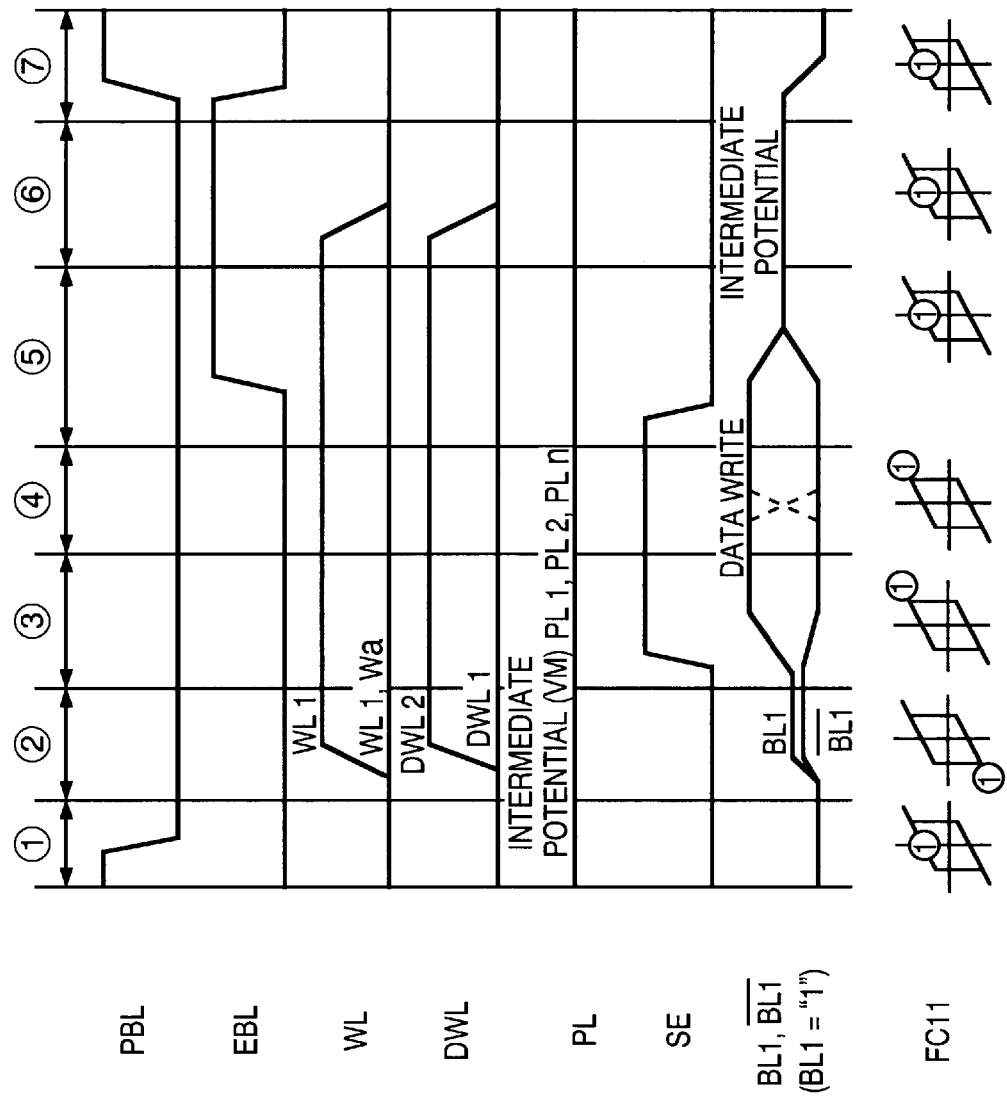
FIG. 6 illustrates timing charts showing an example of the operation of the ferroelectric memory device shown in FIG. 5.
Figure 7:
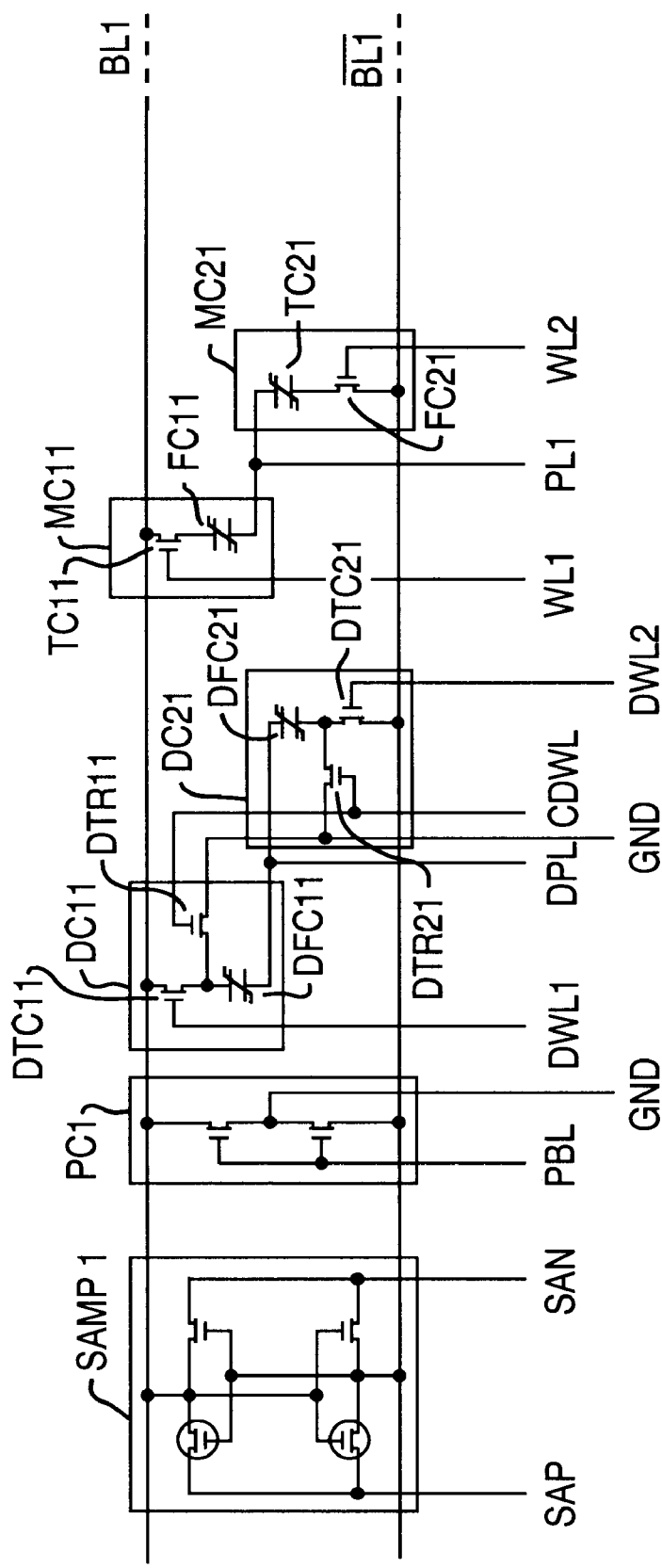
FIG. 7 is a circuit diagram illustrating a memory cell array unit including a reference voltage generating circuit in a prior art ferroelectric memory device.
Figure 8:
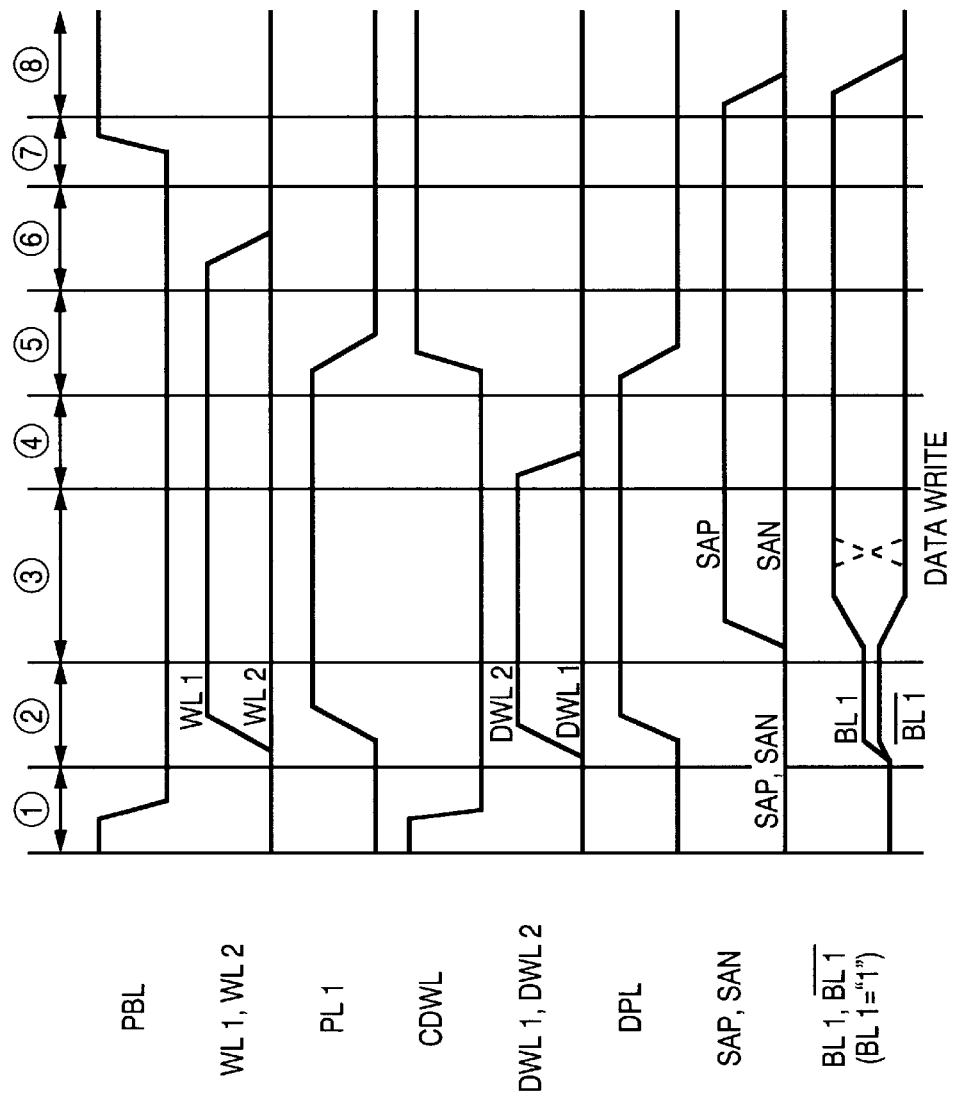
FIG. 8 illustrates timing charts showing an example of the operation of the ferroelectric memory device shown in FIG. 7.
Figure 13:
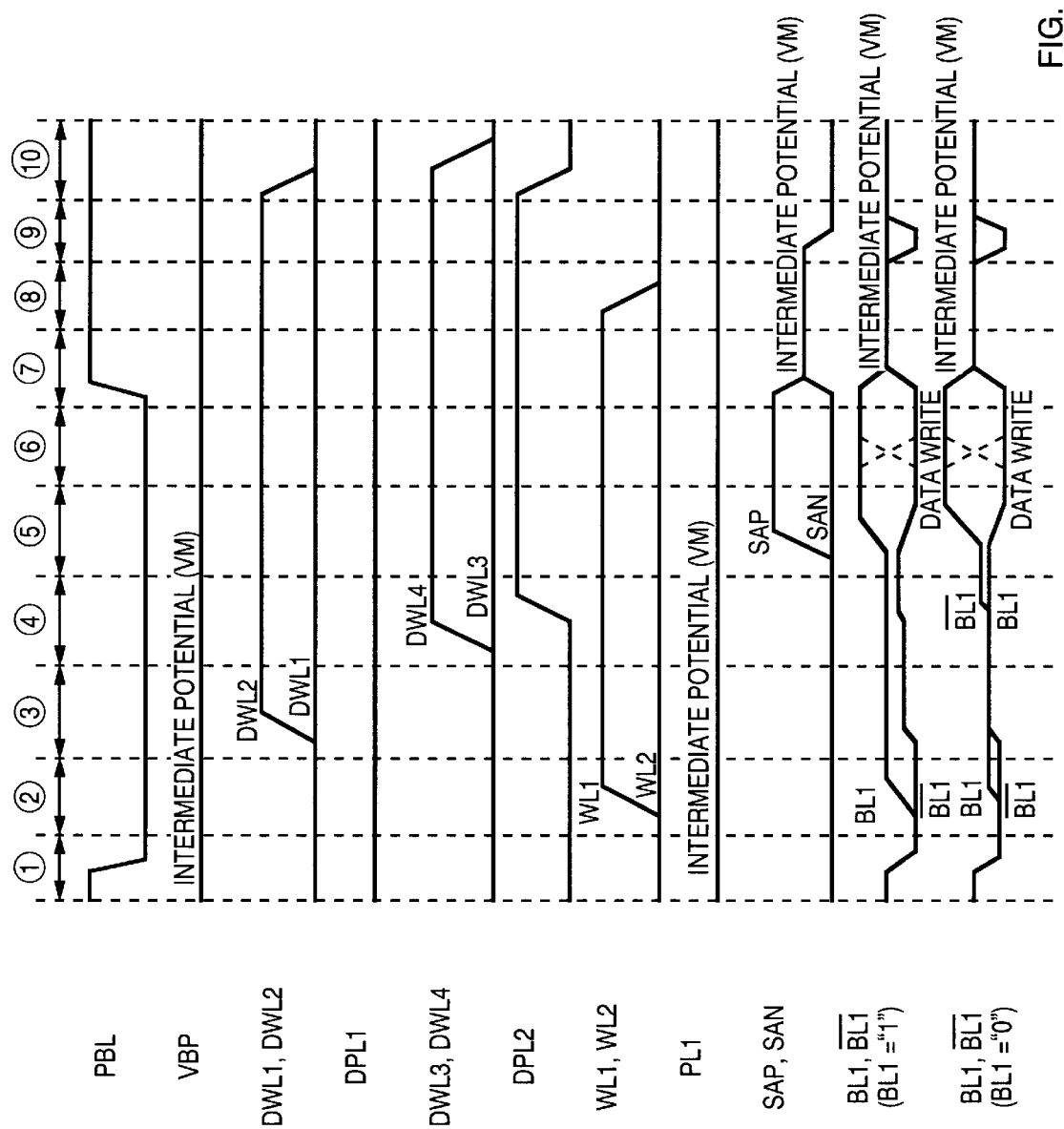
FIG. 13 illustrates timing charts showing an example of the operation of the ferroelectric memory device shown in FIG. 11.

As another embodiment according to the present invention, FIG. 13 illustrates operation timing charts of the ferroelectric memory device shown as the prior art in FIG. 6 when the present invention is applied to a memory device. This embodiment employs the circuit configuration shown in FIG. 11 without any modification.

An essential point of the operation shown in FIG. 6 is that the plate line is set at the intermediate potential and the bit line is operated between the ground potential and the power supply potential, thereby applying voltages both in positive and negative directions across both electrodes of the ferroelectric capacitor to allow for an operation for storage in the ferroelectric memory. For the dummy cell, the reading operation and the writing operation of data "0", "1" are performed in a similar manner to that of the memory cell.

In the present embodiment, from the state where bit line precharge voltage VBP is set at a potential of one half of a power supply voltage and bit lines BL1, $\overline{BL1}$, BL2, $\overline{BL2}$ are set at one half of the power supply voltage, in the subsequent period ①, bit line precharge control signal PBL is changed to the low level to start an access operation to the memory cell. An operation is also performed for precharging bit lines BL1, $\overline{BL1}$, BL2, $\overline{BL2}$ at a ground voltage in period ①, although means (circuit) for the operation is not illustrated in FIG. 11.

Next, in period ②, word line WL1 is changed to the high level to precharge bit line BL1 at the ground voltage. At this point, voltage −Vm is applied to ferroelectric capacitor FC11 in memory cell MC11, assuming that the direction from the plate line to the bit line is a positive direction, since plate line Pl1 is at an intermediate potential Vm. Thus, a signal charge corresponding to stored data is outputted from ferroelectric capacitor FC11 onto bit line BL1.

In the subsequent period ③, when word line DWL2 of the dummy memory cell is changed to the high level in reference voltage generating circuit DC1, a signal voltage $V_0$ corresponding to data "0" is outputted from the dummy memory cell onto bit line $\overline{BL1}$.

In period ④, word line DWL4 is changed to the high level and plate line DPL2 is changed to the high level, thereby obtaining a voltage which is the sum of the read voltage corresponding to data "0" and the voltage corresponding to the sense amplifier sensitivity as the reference voltage onto bit line $\overline{BL1}$ similarly to the operation of FIG. 12. Operations from period ⑤ to ⑥ are similar to those of FIG. 12.

In a reset operation in period ⑦ onward, bit line precharge control signal PBL is changed to the high level, sense amplifier circuit control signals SAP, SAN and bit lines BL1, $\overline{BL1}$, BL2, $\overline{BL2}$ are changed to Vm, respectively. In the next period ⑧, while PL1=BL1=potential is at one half of the power supply voltage, i.e. a voltage across both electrodes of ferroelectric capacitor FC11 remains equal to zero, word line WL1 is returned to the low level to deselect the memory cell. After the levels of bit lines $\overline{BL1}$, $\overline{BL2}$ are once changed to the ground voltage and ferroelectric capacitors DFC21, DFC22 in the dummy memory cells are written with "0" in period ⑨, word lines DWL2, DWL4 are changed to the low level in period ⑩, thereby completing the reading and writing operations for one cycle.

Figure 14:
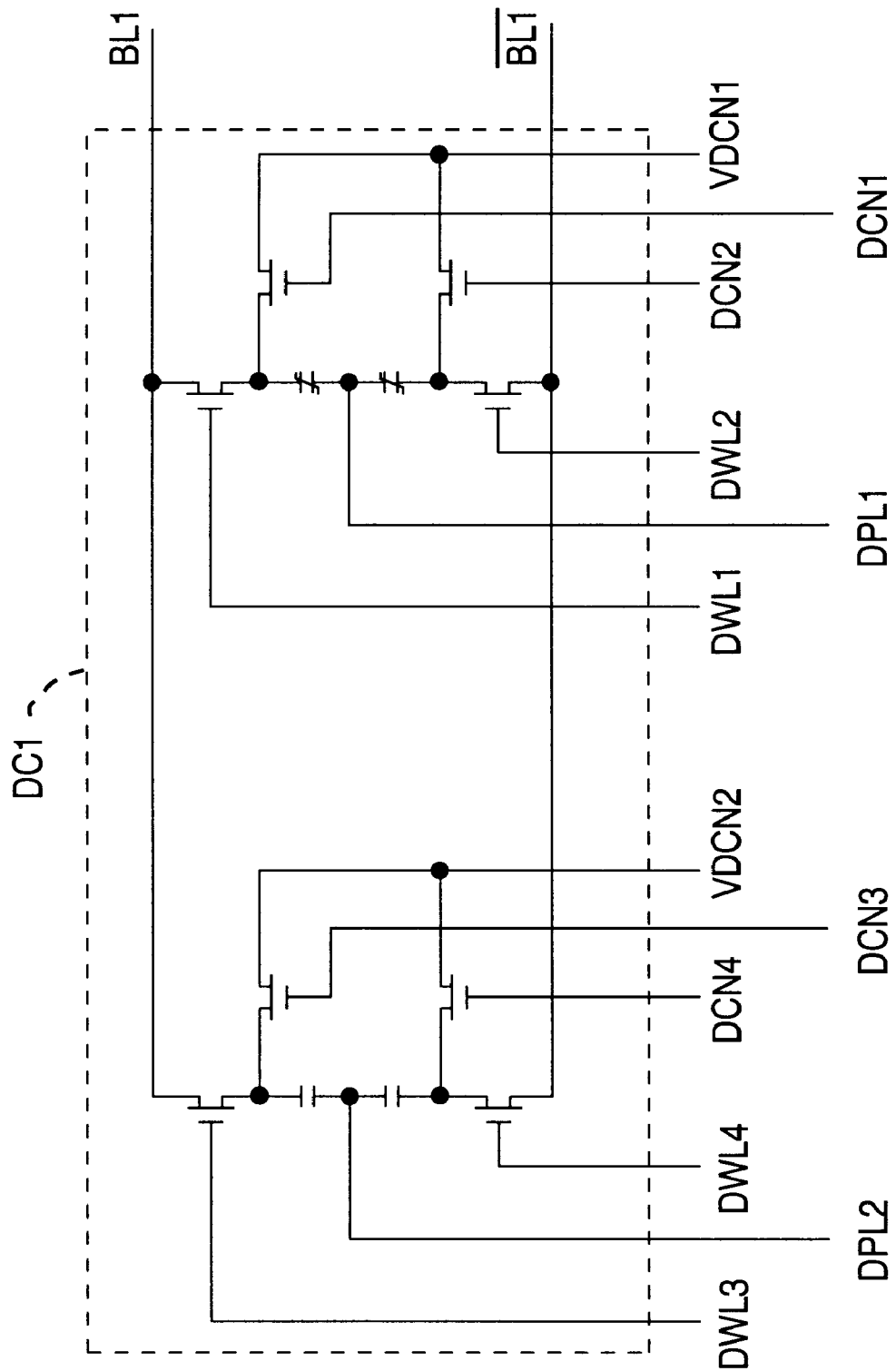
FIG. 14 is a circuit diagram illustrating an example of a configuration of a reference voltage generating circuit in a ferroelectric memory device according to another embodiment of the present invention.
Figure 15:
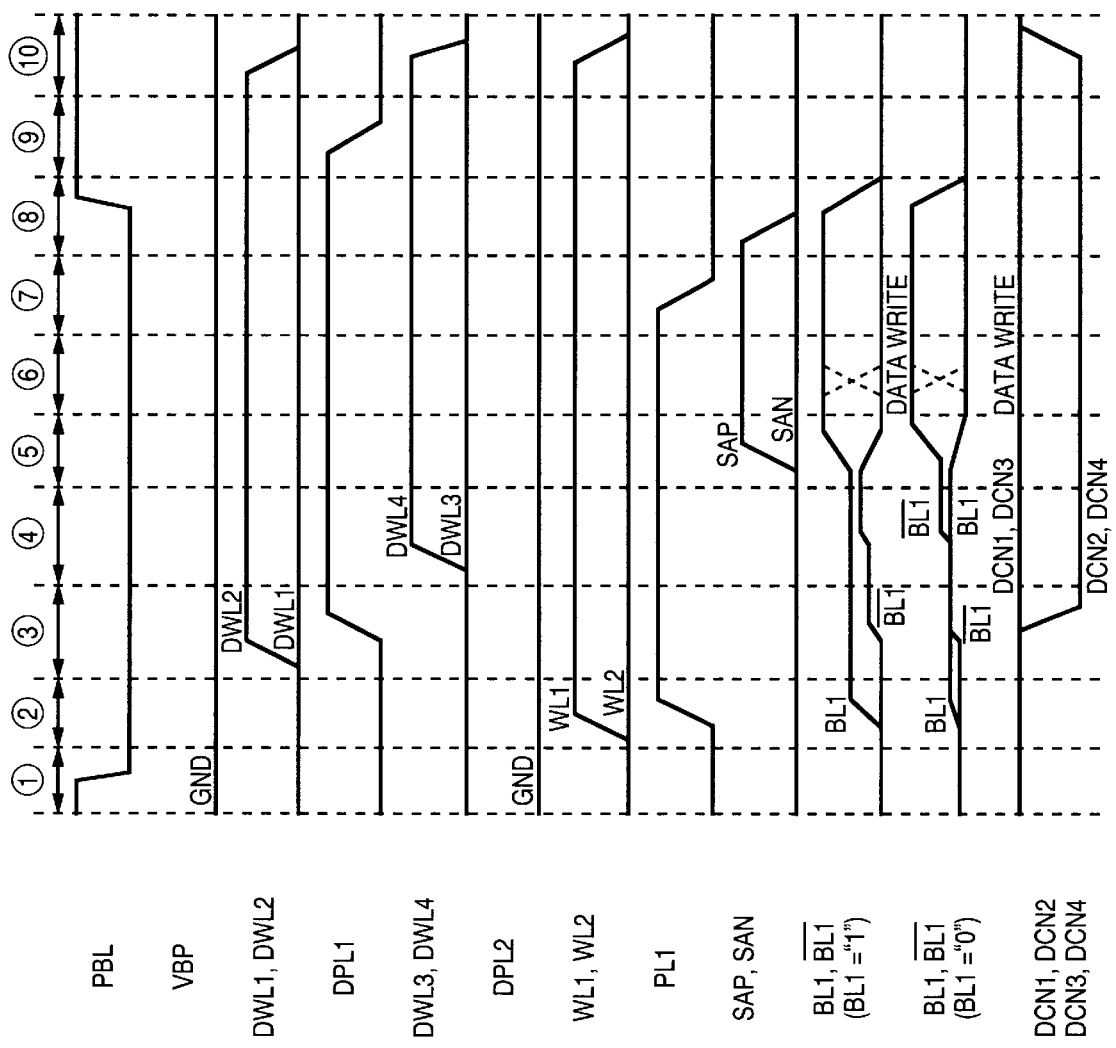
FIG. 15 illustrates timing charts showing an example of the operation of the ferroelectric memory device including the reference voltage generating circuit shown in FIG. 14.

In each embodiment described above, when a voltage at a node connecting the ferroelectric capacitor to the transistor in the memory cell becomes an abnormal level during a waiting period, i.e. a period in which both word line and dummy word lines are at the low level, the reference voltage also becomes an abnormal level. For this reason, there is a method of providing a transistor for voltage compensation at a node in the memory cell in the dummy memory cell as shown in FIG. 14. FIG. 15 illustrates operation timing charts when the circuit shown in FIG. 14 is utilized.

Although the circuit operation of FIG. 15 is substantially similar to that shown in FIG. 13, a difference is that operations for signals DCN1–DCN4 are added for controlling the transistors for voltage compensation at nodes in the memory cell.

By changing voltage values of power supply lines VDCN1, VDCN2 for voltage compensation at nodes in the memory cells, reference voltage values generated from the corresponding dummy memory cells can be adjusted and the problem of the node in the memory cell being in a floating state during the above-mentioned waiting period can be solved at the same time.

Figure 16:
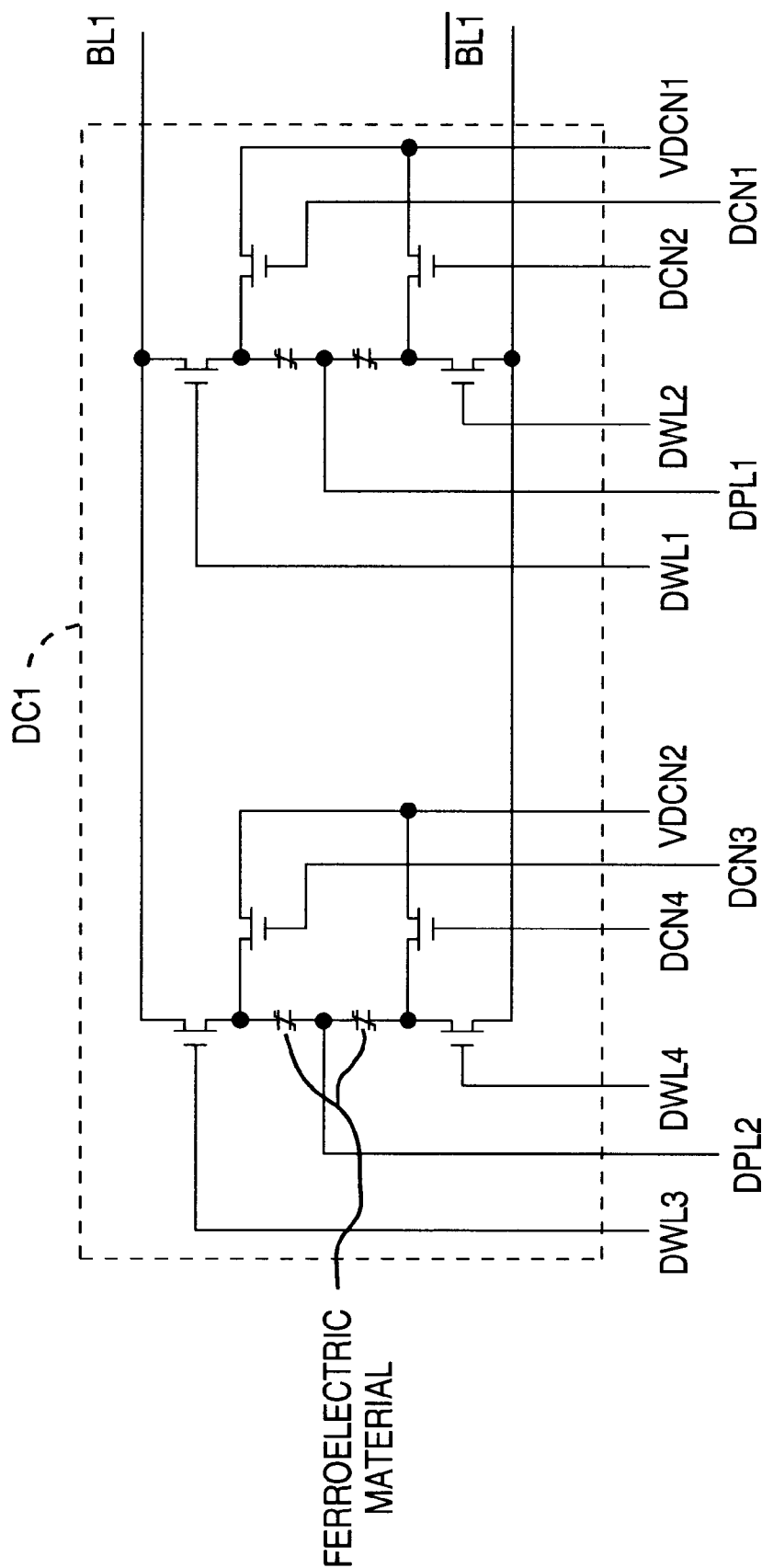
FIG. 16 is a circuit diagram illustrating an example of a configuration of a reference voltage generating circuit in a ferroelectric memory device according to another embodiment of the present invention.

Capacitors corresponding to DFC31, DFC32, DFC41, DFC42 in FIG. 11 and FIG. 14 may be dielectric capacitors or ferroelectric capacitors shown in FIG. 16.

Figure 17:
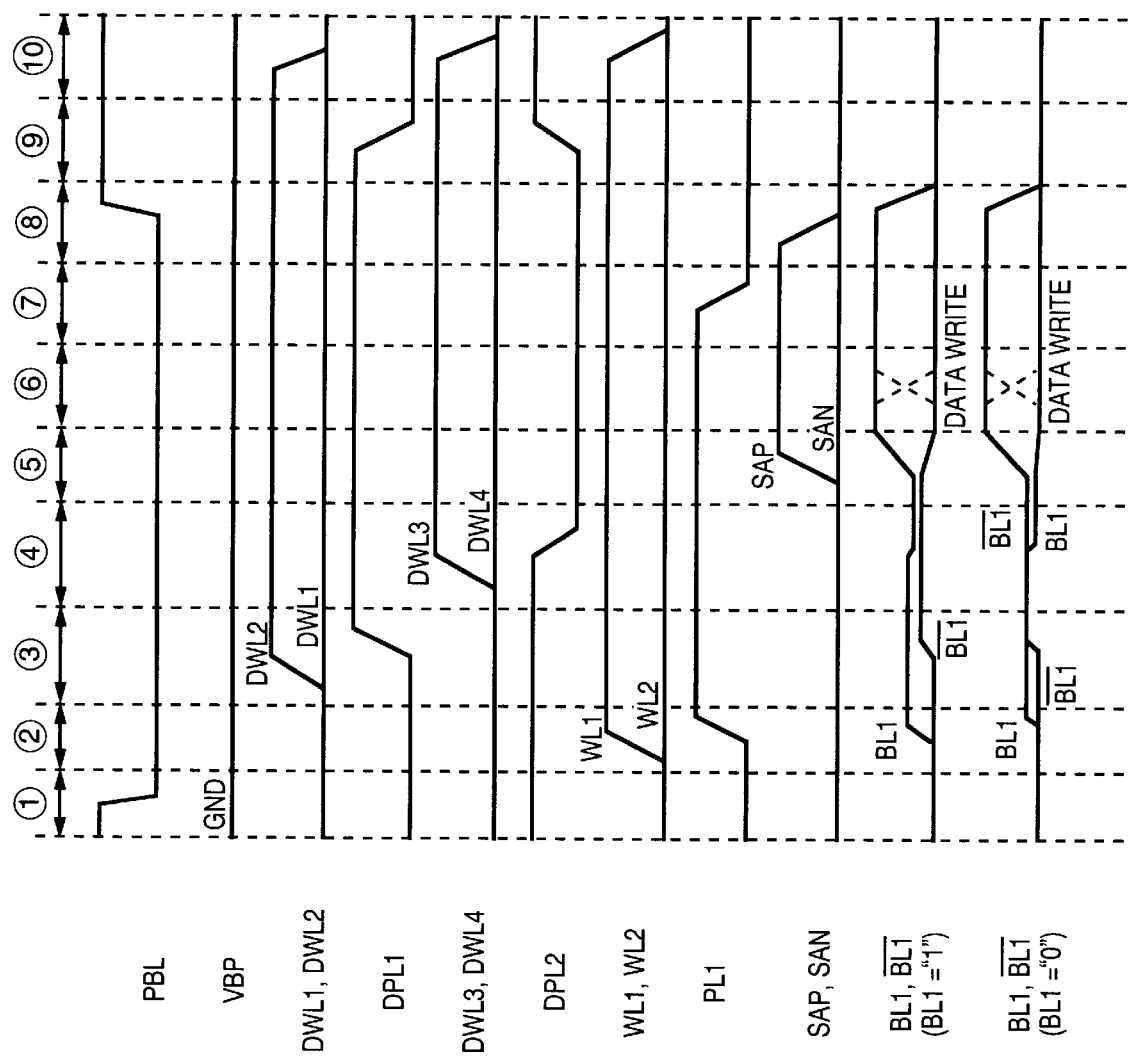
FIG. 17 illustrates timing charts showing an example of the operation of the ferroelectric memory device shown in FIG. 11.
Figure 18:
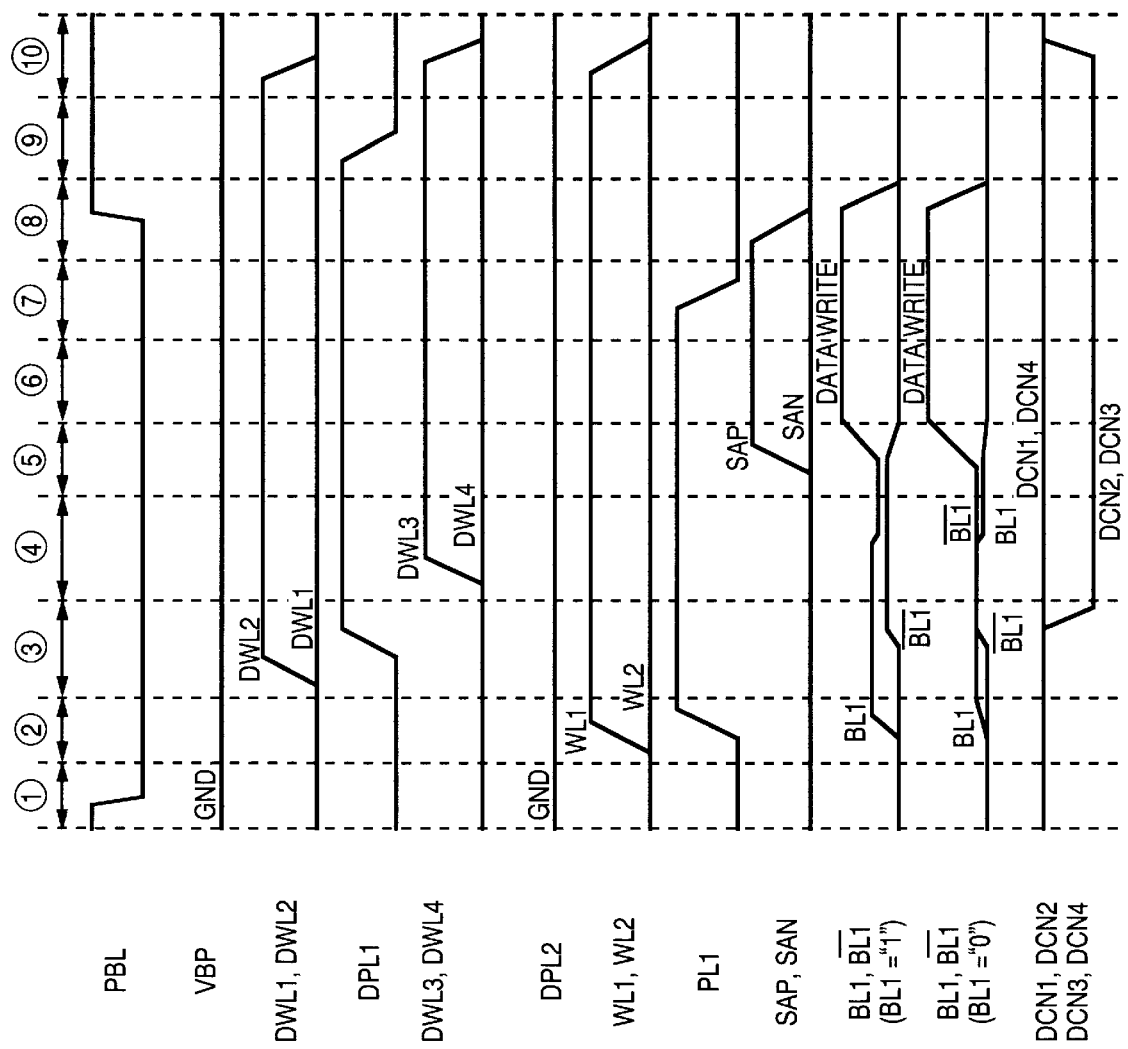
FIG. 18 illustrates timing charts showing an example of the operation of the ferroelectric memory device including the reference voltage generating circuit shown in FIG. 14.

Although each of the embodiments described above employs a method in which voltage $V_0$ is first outputted onto the bit line on the side to which the reference voltage is given and then voltage $\Delta V$ is applied thereto, voltage $V_0$ may be drawn from the bit line on the side to which the reference voltage is given and voltage $\Delta V$ may be drawn from the bit line on the selected memory cell side. FIGS. 17 and 18 illustrate operations in such cases.

The operations of FIG. 17 and FIG. 18 differs from the above-mentioned timing charts of FIG. 12 or the like in that voltage $\Delta V$ is drawn from bit line BL1. More specifically, the operations shown in FIG. 17 are performed in the opposite manner to FIG. 12 such that plate line DPL2 is at the high level during the waiting period and at the low level during an activating period. Also, in the operations shown in FIG. 18, the voltage at the node in the memory cell are set to reduce the bit line voltage for example in the circuit shown in FIG. 14.

While the present invention has been described with various embodiments thereof, it is possible to combine the embodiments for constituting a memory device.

While preferred embodiments of the present invention has(have) been described using specific terms, such description is for illustrative purposes only, and it is to be understood that changes and variations may be made without departing from the spirit or scope of the following claims.

What is claimed is:

1. A ferroelectric memory device comprising:
    a memory cell comprising a field-effect transistor and a ferroelectric capacitor using a ferroelectric material as an insulator film, said memory cell being operated for storage by making the direction of spontaneous polarization of the ferroelectric capacitor correspond to information for storage;
    a sense amplifier circuit for discriminating a difference in amount of charge between an inversed state and a non-inversed state of the direction of the spontaneous polarization of the ferroelectric capacitor in said memory cell to read a signal voltage from said memory cell; and
    reference voltage generating means for generating a reference voltage in order to discriminate the difference in charge amount between the inversed state and the non-inversed state, said reference voltage being a sum of a voltage that exceeds a minimum voltage at which a signal voltage is readable by said sense amplifier circuit from said memory cell and a signal voltage obtained with signal charge stored in said memory cell when a direction of the spontaneous polarization of the ferroelectric capacitor in said memory cell is in the non-inversed state.

2. The ferroelectric memory device according to claim 1, wherein said memory cell includes a field-effect transistor having a source terminal connected to one terminal of the ferroelectric capacitor, a drain terminal connected to a bit line and a gate terminal connected to a word line, the ferroelectric capacitor having the other terminal connected to a plate line,
    said sense amplifier circuit is composed of a sense amplifier comprising first and second terminals, the first terminal being inputted with a signal voltage obtained by reading a signal charge from said memory cell onto the bit line, the second terminal being inputted with the reference voltage, said sense amplifier being provided for differentially amplifying the difference in voltage between the first and the second terminal to discriminate a logical value of the signal charge outputted from said memory cell, and
    said reference voltage generating means generates a reference voltage obtained by adding the voltage exceeding the sense amplifier sensitivity which is the minimum voltage at which the sense amplifier is capable of amplifying the signal voltage read from said memory cell to a signal voltage obtained by reading the signal charge when the direction of the spontaneous polarization of the ferroelectric capacitor in said memory cell is in the non-inversed state onto the bit line.

3. The ferroelectric memory device according to claim 2, wherein said reference voltage generating means has first and second dummy memory cells,
    the first dummy memory cell comprises a transistor and a ferroelectric capacitor, the transistor having a gate terminal connected to a first dummy word line, a source terminal connected directly to or connected electrically through a transfer gate to the second terminal of the sense amplifier, and a drain terminal connected to one terminal of the ferroelectric capacitor, the ferroelectric capacitor having the other terminal connected to a first dummy plate line, and
    said second dummy memory cell comprises a transistor and a capacitor, the transistor having a gate terminal connected to a second dummy word line, a source terminal connected to the source terminal of the transistor in the first dummy cell, and a drain terminal connected to one terminal of the capacitor, the capacitor having the other terminal connected to a second dummy plate line.

4. The ferroelectric memory device according to claim 3, wherein the capacitor in the first dummy memory cell is the same shape as that of said memory cell.

5. The ferroelectric memory device according to claim 3, wherein the capacitor in the second dummy memory cell comprises a parasitic capacitance including one of a gate capacitance, a capacitance between wiring layer, or a diffusion layer capacitance, or a combination thereof.

6. The ferroelectric memory device according to claim 3, wherein the capacitor in the second dummy memory cell uses a dielectric component of a ferroelectric capacitor.

7. The ferroelectric memory device according to claim 3, wherein the terminal connecting the transistor to the ferroelectric capacitor in the first dummy memory cell is connected to a drain terminal of a second transistor different from said transistor, the second transistor having a source terminal connected to a signal line for giving a predetermined voltage, and a gate terminal is connected to a third dummy word line.

8. The ferroelectric memory device according to claim 7, wherein the voltage exceeding the sense amplifier sensitivity is adjusted by a voltage value given to the signal line connected to the source terminal of the second transistor.

9. The ferroelectric memory device according to claim 7, wherein the terminal connecting the transistor to the capacitor in the second dummy memory cell is connected to a drain terminal of a third transistor different from said transistor, the third transistor having a source terminal connected to a second signal line for giving a predetermined voltage, and a gate terminal is connected to a fourth dummy word line.

10. The ferroelectric memory device according to claim 3, wherein the terminal connecting the transistor to the capacitor in the first dummy memory cell is connected to a drain terminal of a third transistor different from said transistor, the third transistor having a source terminal connected to a second signal line for giving a predetermined voltage, and a gate terminal is connected to a fourth dummy word line.

11. The ferroelectric memory device according to claim 3, wherein the source terminal of the transistor in the second dummy memory cell is connected directly to or connected electrically through a transfer gate to the second terminal of the sense amplifier.

12. The ferroelectric memory device according to claim 3, wherein said memory cells are arranged in matrix configuration and comprise a circuit system including one or a plurality of the sense amplifier for a memory cell array.

13. The ferroelectric memory device according to claim 3, wherein the voltage exceeding the sense amplifier sensitivity is set depending on a dielectric capacitance value of the capacitor in the second dummy memory cell.

14. The ferroelectric memory device according to claim 3, comprising driving means for driving a voltage on the second dummy plate line from a first voltage level to a second voltage level, wherein the voltage exceeding the sense amplifier sensitivity is adjusted by driving the second dummy plate line from the first voltage level to the second voltage level.

15. A method of reading data from a ferroelectric memory device having a memory cell comprising a field-effect transistor and a ferroelectric capacitor using a ferroelectric material as an insulator film, comprising the steps of:

operating for storage by making a direction of spontaneous polarization of the ferroelectric capacitor correspond to information for storage;

discriminating a difference in charge amount between an inversed state and a non-inversed state of the direction of the spontaneous polarization in said memory cell to read a signal voltage from said memory cell; and obtaining a reference voltage for discriminating the difference in amount of charge between the inversed state and the non-inversed state, said reference voltage being a sum of a voltage that exceeds a minimum voltage at which a signal voltage is readable by the sense amplifier circuit from said memory cell and a signal voltage obtained with signal charge stored in said memory cell when the direction of the spontaneous polarization of the ferroelectric capacitor in said memory cell is in the non-inversed state.

16. The method of reading data from ferroelectric memory device according to claim 15, wherein the reference voltage is a voltage obtained by adding a voltage exceeding the sense amplifier sensitivity which is the minimum voltage at which the sense amplifier is capable of amplifying the signal voltage read from said memory cell to a signal voltage obtained by reading the signal charge corresponding to a case in which the direction of the spontaneous polarization of the ferroelectric capacitor in said memory cell is in the non-inversed state onto the bit line of said memory cell.

17. A ferroelectric memory device comprising:

a ferroelectric capacitor having a ferroelectric material insulator film, said ferroelectric capacitor having a first state corresponding to an inversed polarization and a second state corresponding to a non-inversed polarization;

a sense amplifier, coupled to said ferroelectric capacitor to discriminate between a first voltage provided when said ferroelectric capacitor is in said first state and a second voltage provided when said ferroelectric capacitor is in said second states; and a reference voltage generator that provides to said sense amplifier a reference voltage between said first and second voltages, wherein said reference voltage is set to a sum of the first voltage and a voltage that exceeds a minimum voltage at which a signal voltage is readable by said sense amplifier.

18. A ferroelectric memory device, according to claim 16, further comprising:

a field effect transistor having a source terminal coupled to said ferroelectric capacitor, a drain terminal connected to a bit line, and a gate terminal connected to a word line, whereby providing a word signal to said word line causes said bit terminal to provide a signal that varies according to the state of said ferroelectric capacitor.

* * * * *